(12) United States Patent
Saito

(10) Patent No.: US 12,273,088 B2
(45) Date of Patent: Apr. 8, 2025

(54) FILTER, MULTIPLEXER, AND COMMUNICATION MODULE

(71) Applicant: TAIYO YUDEN CO., LTD., Tokyo (JP)

(72) Inventor: Toshiyuki Saito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 260 days.

(21) Appl. No.: 18/076,936

(22) Filed: Dec. 7, 2022

(65) Prior Publication Data

US 2023/0208377 A1    Jun. 29, 2023

(30) Foreign Application Priority Data

Dec. 23, 2021 (JP) ................. 2021-209211

(51) Int. Cl.
*H03H 7/01* (2006.01)
*H01F 27/28* (2006.01)
*H03H 7/46* (2006.01)

(52) U.S. Cl.
CPC ....... *H03H 7/0115* (2013.01); *H01F 27/2804* (2013.01); *H03H 7/46* (2013.01)

(58) Field of Classification Search
CPC ...... H03H 7/0115; H03H 7/46; H03H 7/1725; H03H 7/1791; H03H 7/09; H03H 7/1708; H03H 7/1775; H03H 2001/0085; H01F 27/2804; H01F 2017/0026; H01F 17/0013
See application file for complete search history.

(56) References Cited

U.S. PATENT DOCUMENTS

| | | | | |
|---|---|---|---|---|
| 3,718,874 A | * | 2/1973 | Cooper, Jr. | H03H 7/0161 336/200 |
| 7,907,034 B2 | * | 3/2011 | Taniguchi | H03H 7/09 333/175 |
| 9,252,737 B2 | * | 2/2016 | Imamura | H03H 7/12 |
| 2007/0013462 A1 | * | 1/2007 | Fan | H03H 7/1775 333/185 |
| 2008/0272855 A1 | | 11/2008 | Ono et al. | 333/134 |
| 2015/0155844 A1 | | 6/2015 | Mizoguchi | |

FOREIGN PATENT DOCUMENTS

| | | |
|---|---|---|
| JP | 2008-278360 A | 11/2008 |
| JP | 2015-109487 A | 6/2015 |

* cited by examiner

*Primary Examiner* — Andrea Lindgren Baltzell
*Assistant Examiner* — Kimberly E Glenn
(74) *Attorney, Agent, or Firm* — Stein IP LLC

(57) ABSTRACT

A filter includes a first resonance circuit including a first capacitor and a first inductor connected in parallel between a ground terminal and a first node electrically connected to a first signal terminal not through any capacitor, no inductor being connected in series with the first capacitor between the first node and the ground terminal, a second resonance circuit including a second capacitor and a second inductor connected in parallel between the ground terminal and a second node electrically connected to a second signal terminal not through any capacitor, and a third resonance circuit including a third capacitor and a third inductor connected in parallel between a third node, located in a path through which a high-frequency signal is transmitted between the first and second nodes, and the ground terminal, and a first series inductor connected in series with the third capacitor between the third node and the ground terminal.

11 Claims, 24 Drawing Sheets

FILTER, MULTIPLEXER, AND COMMUNICATION MODULE

CROSS-REFERENCE TO RELATED APPLICATION

This application is based upon and claims the benefit of priority of the prior Japanese Patent Application No. 2021-209211, filed on Dec. 23, 2021, the entire contents of which are incorporated herein by reference.

FIELD

A certain aspect of the present disclosure relates to a filter, a multiplexer, and a communication module.

BACKGROUND

Radio communication terminals for LTE (long term evolution) and 5G (5th generation) mobile communication systems use filters that remove unnecessary interference waves. As a filter, a filter having a plurality of LC parallel resonance circuits between a path through which a high-frequency signal is transmitted and a ground terminal is known. It is known to provide an LC auxiliary parallel resonance circuit between a plurality of LC parallel resonance circuits and a ground terminal as disclosed in Japanese Patent Application Laid-Open No. 2015-109487 (Patent Document 1). It is known that an inductor is connected in series with capacitors of a plurality of LD parallel resonance circuits as disclosed in Japanese Patent Application Laid-Open No. 2008-278360 (Patent Document 2).

SUMMARY

In Patent Documents 1 and 2, it is possible to adjust the frequency of an attenuation pole located at a frequency higher than the passband. However, in Patent Document 1, when the frequency of the attenuation pole is adjusted, the attenuation characteristics in frequencies lower than the passband are changed. In Patent Document 2, when the frequency of the attenuation pole is adjusted, the attenuation characteristics in a frequency range higher than the attenuation pole deteriorate.

An object of the present disclosure is to inhibit a change in attenuation characteristics when the frequency of an attenuation pole is adjusted.

In one aspect of the present disclosure, there is provided a filter including: a first signal terminal; a second signal terminal; a ground terminal; a first resonance circuit including a first capacitor and a first inductor that are connected in parallel between a ground terminal and a first node electrically connected to the first signal terminal not through any capacitor, wherein an inductor is not connected in series with the first capacitor between the first node and the ground terminal; a second resonance circuit including a second capacitor and a second inductor that are connected in parallel between the ground terminal and a second node electrically connected to the second signal terminal not through any capacitor; and a third resonance circuit including a third capacitor, a third inductor, and a first series inductor, the third capacitor and the third inductor being connected in parallel between a third node and the ground terminal, the first series inductor being connected in series with the third capacitor between the third node and the ground terminal, the third node being located in a path through which a high-frequency signal can be transmitted between the first node and the second node.

In another aspect of the present disclosure, there is provided a multiplexer including the above filter.

In another aspect of the present disclosure, there is provided a communication module including the above filter.

DETAILED DESCRIPTION

Hereinafter, embodiments of the present disclosure will be described with reference to the drawings.

First Embodiment

Figure 1:
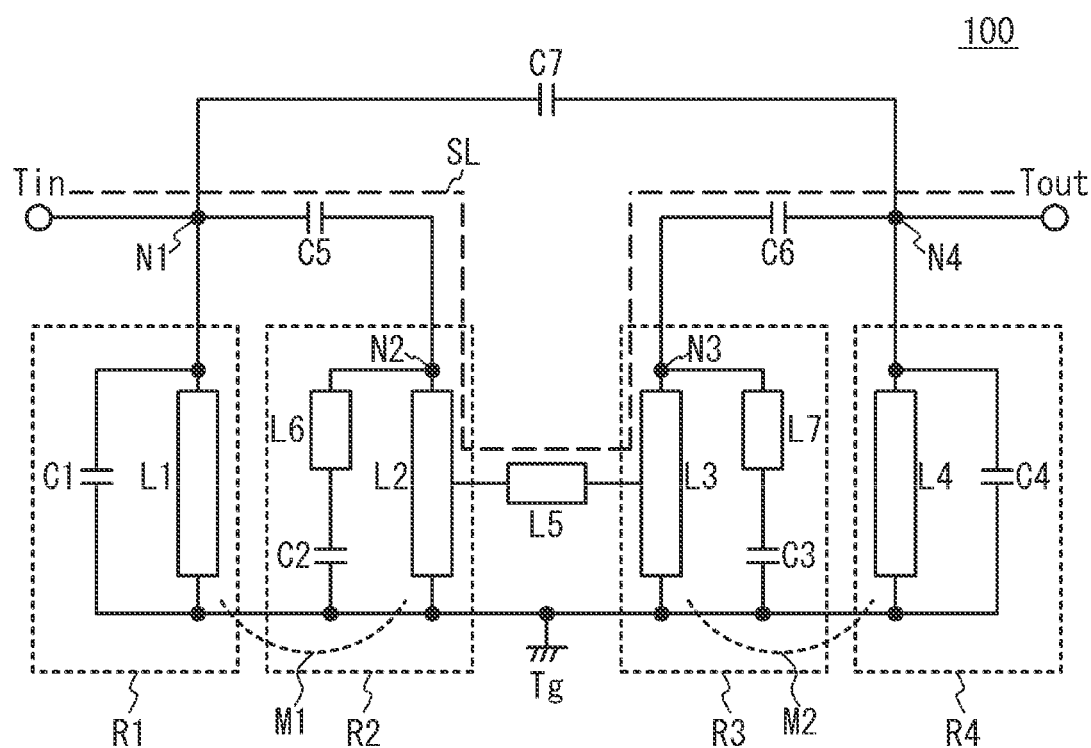
FIG. 1 is a circuit diagram of a filter in accordance with a first embodiment.

As a first embodiment, a bandpass filter (BPF) will be described as an example. FIG. 1 is a circuit diagram of a filter in accordance with the first embodiment. As illustrated in FIG. 1, a filter 100 in accordance with the first embodiment includes an input terminal Tin, an output terminal Tout, aground terminal Tg, capacitors C1 to C7, and inductors L1 to L7. A high-frequency signal input from the input terminal Tin is output from the output terminal Tout through a path SL. The path SL includes the capacitor C5, a part of the inductor L2, the inductor L5, a part of the inductor L3, and the capacitor C6. Nodes N1 to N4 are provided in the path SL.

A parallel resonance circuit R1 is provided between the node N1 and the ground terminal Tg. The parallel resonance circuit R1 includes the inductor L1 and the capacitor C1 connected in parallel between the node N1 and the ground terminal Tg. A parallel resonance circuit R2 is provided between the node N2 and the ground terminal Tg. The parallel resonance circuit R2 includes the inductor L2 and the capacitor C2 connected in parallel between the node N2 and the ground terminal Tg. A parallel resonance circuit R3 is provided between the node N3 and the ground terminal Tg. The parallel resonance circuit R3 includes the inductor L3 and the capacitor C3 connected in parallel between the node N3 and the ground terminal Tg. A parallel resonance circuit R4 is provided between the node N4 and the ground terminal Tg. The parallel resonance circuit R4 includes the inductor L4 and the capacitor C4 connected in parallel between the node N4 and the ground terminal Tg.

The parallel resonance circuit R2 includes the inductor L6 connected in series with the capacitor C2 between the node N2 and the ground terminal Tg. The parallel resonant circuit R3 includes the inductor L7 connected in series with the capacitor C3 between the node N3 and the ground terminal Tg.

The node N1 is directly connected to the input terminal Tin. That is, no capacitor is provided between the node N1 and the input terminal Tin. The node N4 is directly connected to the output terminal Tout. That is, no capacitor is provided between the node N4 and the output terminal Tout. The capacitor C5 is provided between the nodes N1 and N2, a first end of the capacitor C5 is electrically connected to the node N1, and a second end of the capacitor C5 is electrically connected to the node N2. The capacitor C6 is provided between the nodes N3 and N4, a first end of the capacitor C6 is electrically connected to the node N4, and a second end of the capacitor C6 is electrically connected to the node N3. No capacitor is provided between the nodes N2 and N3. The capacitor C7 is connected in parallel to the path SL between the nodes N1 and N4. Magnetic field coupling M1 between the inductors L1 and L2 is established, and magnetic field coupling M2 between the inductors L3 and L4 is established.

Figure 2A:
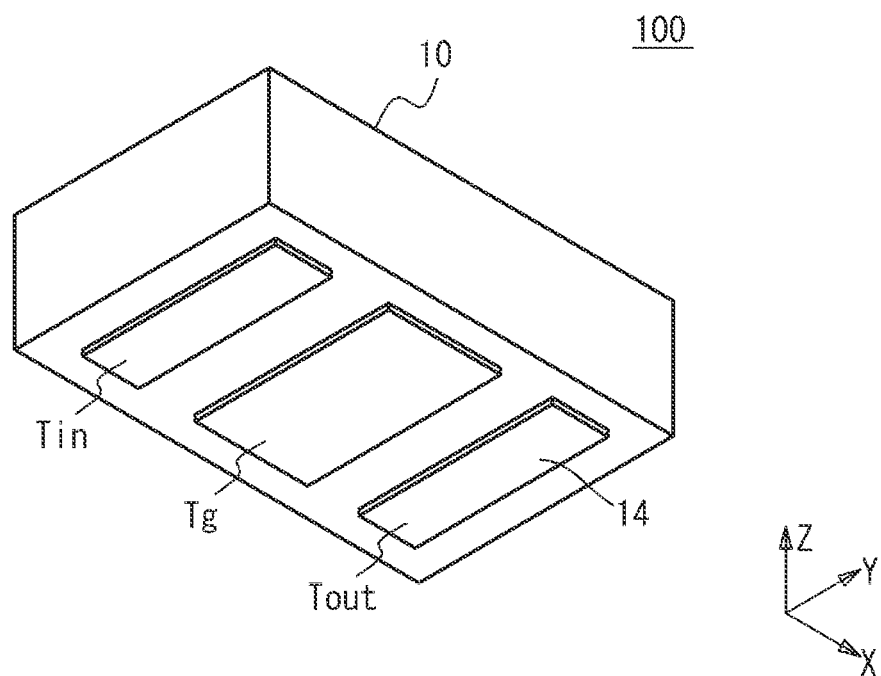
FIG. 2A and FIG. 2B are a perspective view and a cross-sectional view of the filter in accordance with the first embodiment, respectively.
Figure 2B:
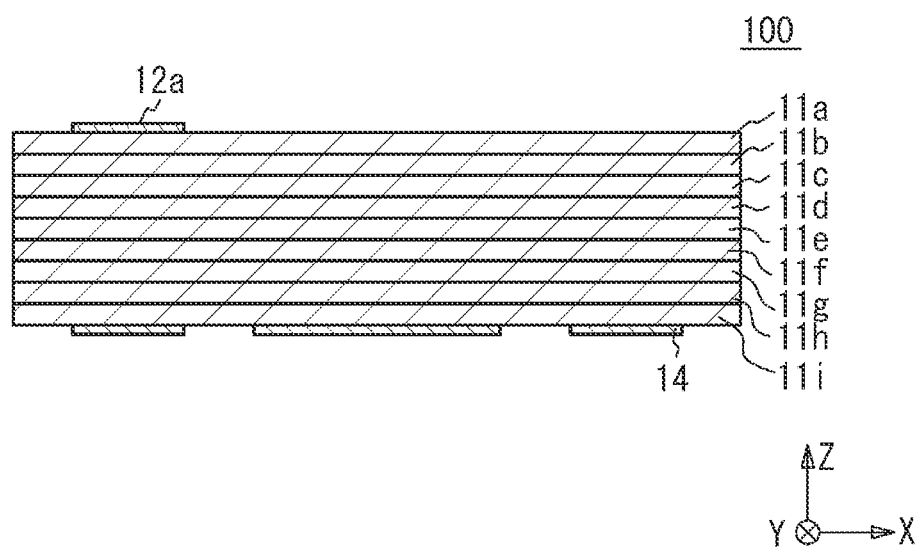

FIG. 2A and FIG. 2B are a perspective view and a cross-sectional view of the filter in accordance with the first embodiment, respectively. A stacking direction of dielectric layers 11a to 11i is defined as a Z direction, an arrangement direction of terminals 14 of the planar directions of the dielectric layers 11a to 11i is defined as an X direction, and a direction orthogonal to the X direction is defined as a Y direction. As illustrated in FIG. 2A and FIG. 2B, the filter 100 includes a multilayer body 10. The multilayer body 10 includes a plurality of the dielectric layers 11a to 11i that are stacked. The terminals 14 are provided on the bottom surface of the multilayer body 10 (a surface of the multilayer body 10 in the stacking direction). The terminals 14 are, for example, the input terminal Tin, the output terminal Tout, and the ground terminal Tg. On the top surface of the multilayer body 10, a direction identification mark is provided by a conductor pattern 12a.

Figure 3:
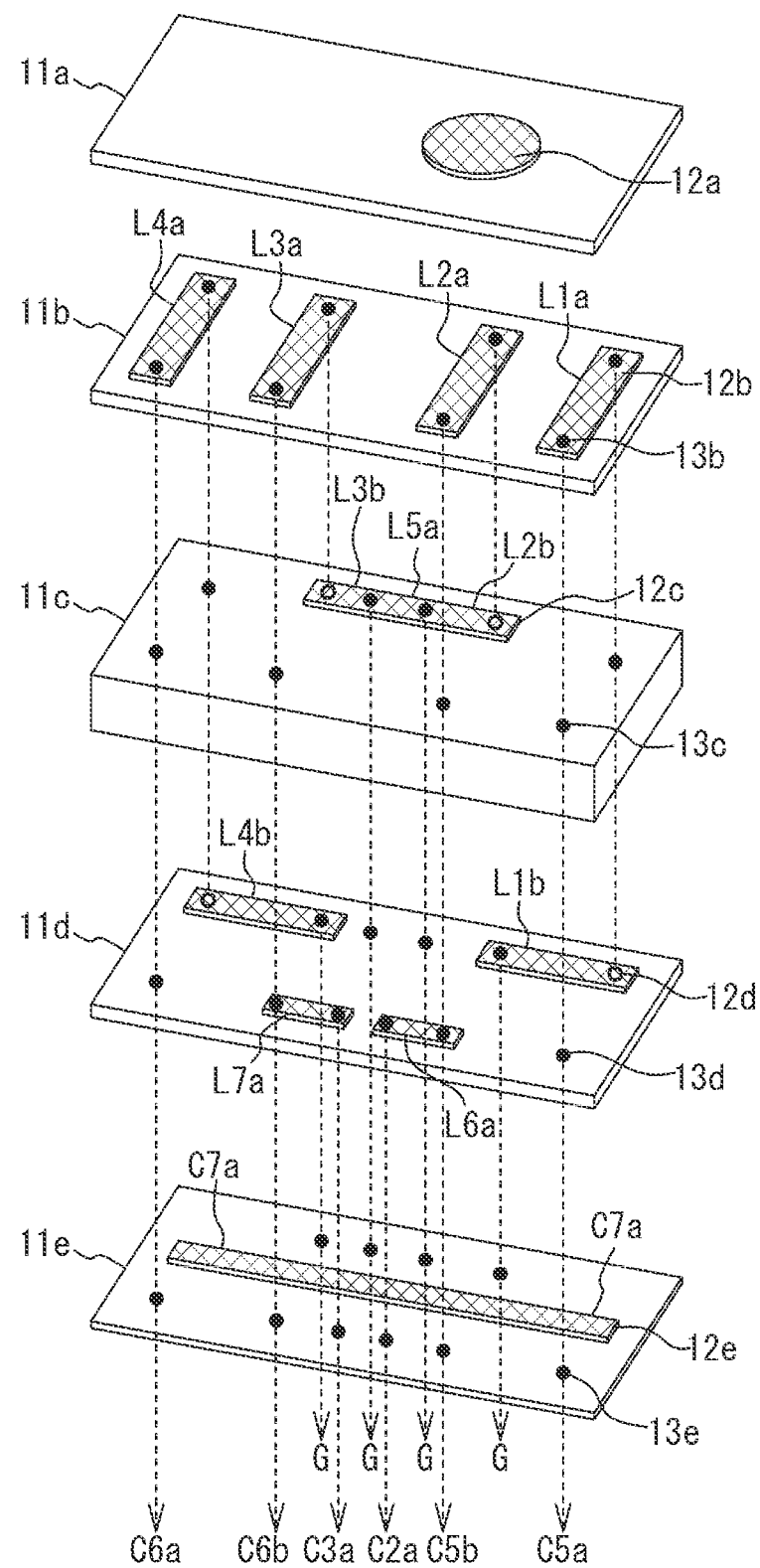
FIG. 3 is an exploded perspective view of dielectric layers in the first embodiment.
Figure 4:
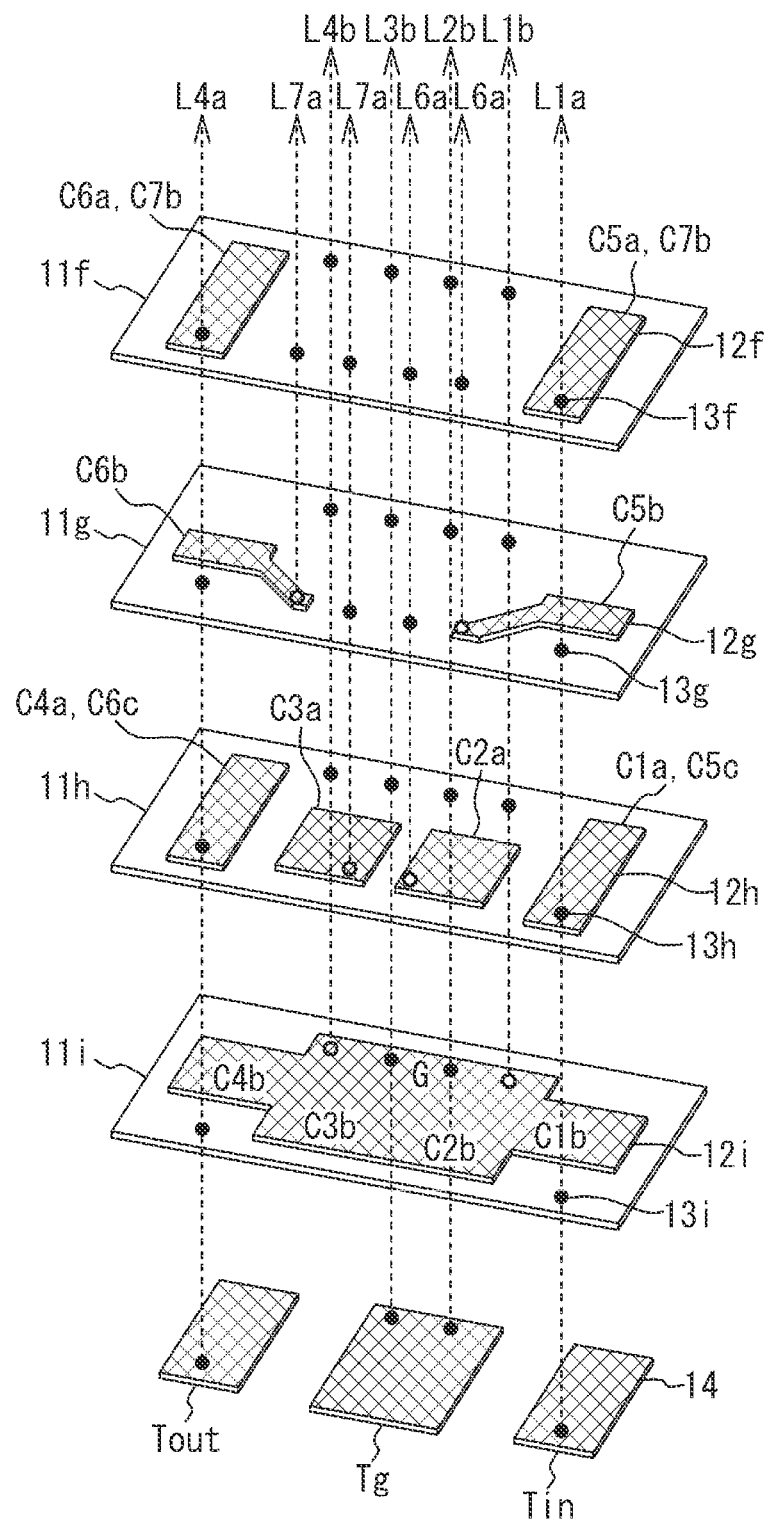
FIG. 4 is an exploded perspective view of the dielectric layers in the first embodiment.

FIG. 3 and FIG. 4 are exploded perspective views of the dielectric layers in the first embodiment. In FIG. 3 and FIG. 4, via wirings 13b to 13i penetrating through the dielectric layers 11b to 11i are indicated by black circles on the upper surfaces of the dielectric layers 11b to 11i, respectively. When the via wirings 13b to 13g that penetrate through the dielectric layers 11b to 11g immediately above the dielectric layers 11c to 11i do not penetrate through the corresponding dielectric layers 11c to 11i, the via wirings 13b to 13g are indicated by white circles. As illustrated in FIG. 3 and FIG. 4, conductor patterns 12a to 12i are provided on the upper surfaces of the dielectric layers 11a to 11i, respectively. The via wirings 13b to 13i penetrating through the dielectric layers 11b to 11i, respectively, are provided. The terminals 14 are provided on the lower surface of the dielectric layer 11i.

On the upper surface of the dielectric layer 11a, the conductor pattern 12a forming a direction identification mark is provided. The conductor patterns 12b forming line patterns L1a to L4a are provided on the upper surface of the dielectric layer 11b. On the upper surface of the dielectric layer 11c, the conductor pattern 12c forming line patterns L2b, L5a, and L3b is provided. The conductor patterns 12d forming line patterns L1b, L4b, L6a, and L7a are provided on the upper surface of the dielectric layer 11d.

The inductor L1 is formed by the line patterns L1a and L1b and the via wirings 13b to 13i. The inductor L2 is formed by the line patterns L2a and L2b and the via wirings 13b to 13i. The inductor L3 is formed by the line patterns L3a and L3b and the via wirings 13b to 13i. The inductor L4 is formed by the line patterns L4a and L4b and the via wirings 13b to 13i. The inductor L5 is formed by the line pattern L5a. The inductor L6 is formed by the line pattern L6a and the via wirings 13d to 13g. The inductor L7 is formed by the line pattern L7a and the via wirings 13d to 13g.

The conductor pattern 12e forming an electrode C7a is provided on the upper surface of the dielectric layer 11e. The conductor patterns 12f forming electrodes C5a, C6a, and C7b are provided on the upper surface of the dielectric layer 11f. On the upper surface of the dielectric layer 11g, the conductor patterns 12g forming electrodes C5b and C6b are provided. The conductor patterns 12h forming electrodes C1a, C2a, C3a, C4a, C5c, and C6c are provided on the upper surface of the dielectric layer 11h. On the upper surface of the dielectric layer 11i, the conductor pattern 12i that functions as electrodes C1b, C2b, C3b, and C4b and forms a ground pattern G is provided.

The capacitor C1 is formed by the electrodes C1a and C1b sandwiching the dielectric layer 11h therebetween. The capacitor C2 is formed by the electrodes C2a and C2b sandwiching the dielectric layer 11h therebetween. The capacitor C3 is formed by the electrodes C3a and C3b sandwiching the dielectric layer 11h therebetween. The capacitor C4 is formed by the electrodes C4a and C4b sandwiching the dielectric layer 11h therebetween. The capacitor C5 is formed by the electrodes C5a and C5b sandwiching the dielectric layer 1 if therebetween and the electrodes C5b and C5c sandwiching the dielectric layer 11g therebetween. The capacitor C6 is formed by the electrodes C6a and C6b sandwiching the dielectric layer 11f therebetween and the electrodes C6b and C6c sandwiching the dielectric layer 11g therebetween. The capacitor C7 is formed by the electrodes C7a and C7b sandwiching the dielectric layer 11e therebetween. The terminals 14 are formed on the lower surface of the dielectric layer 11i. The terminals 14 include the input terminal Tin, the output terminal Tout, and the ground terminal Tg.

A first end of the line pattern L1a is electrically connected to the electrode C1a (corresponding to the node N1) and the input terminal Tin through the via wirings 13b to 13i. Thus, the electrode C1a of the capacitor C1 and the input terminal Tin are electrically connected to each other not through any line pattern. A first end of the line pattern L2a is electrically connected to the electrodes C5b (corresponding to the node N2) through the via wirings 13b to 13f, and is electrically connected to the electrode C2a through the line pattern L6a and the via wirings 13d to 13g. In this manner, the electrode C2a of the capacitor C2 is electrically connected to the electrode C5b corresponding to the node N2 through the line pattern L6a. Similarly to the capacitor C2, the electrode C3a of the capacitor C3 is electrically connected to the electrode C6b corresponding to the node N3 through the line pattern L7a. Similarly to the capacitor C1, the electrode C4a of the capacitor C4 is electrically connected to the terminal Tout not through any line pattern.

The dielectric layers 11a to 11i are made of a ceramic material and contain, for example, an oxide of silicon (Si), calcium (Ca), and magnesium (Mg) (e.g., $CaMgSi_2O_6$, which is a diopside crystal) as a main component. The main components of the dielectric layers 11a to 11i may be oxides other than an oxide of Si, Ca, and/or Mg. Furthermore, the dielectric layers 11a to 11h may contain an oxide of at least one of Ti, Zr, or Al as an insulating material.

The conductor patterns 12a to 12i, the via wirings 13b to 13i, and the upper portions of the terminals 14 are metal layers containing, for example, Ag, Pd, Pt, Cu, Ni, Au, Au—Pd alloy, or Ag—Pt alloy as a main component. The upper portion of the terminal 14 may contain a non-conductive material such as $TiO_2$, $ZrO_2$, or $Al_2O_3$ in addition to the above metal material. The lower portion of the terminal 14 is a Ni film and a Sn film.

First Comparative Example

Figure 5:
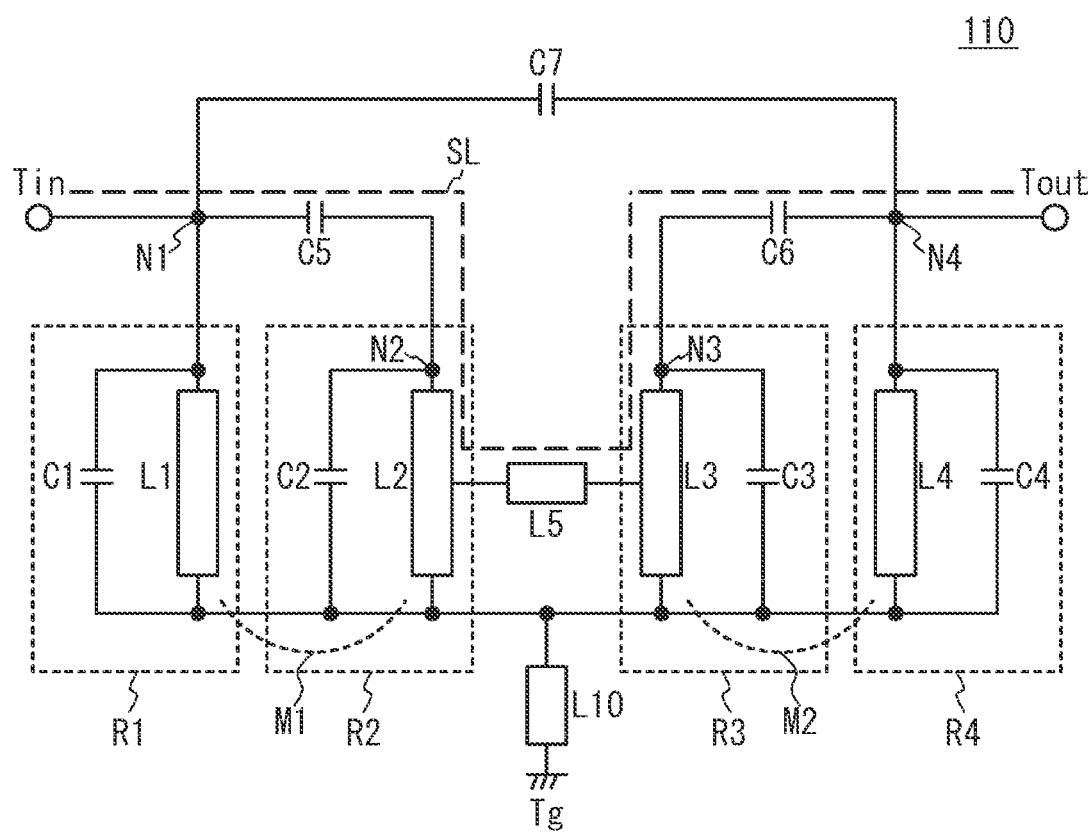
FIG. 5 is a circuit diagram of a filter in accordance with a first comparative example.

FIG. 5 is a circuit diagram of a filter in accordance with a first comparative example. As illustrated in FIG. 5, in a filter 110 of the first comparative example, the inductor L6 connected in series with the capacitor C2 is not provided in the parallel resonance circuit R2. In the parallel resonance circuit R3, the inductor L7 connected in series with the capacitor C3 is not provided. An inductor L10 is provided between the parallel resonance circuits R1 to R4 and the ground terminal Tg. Other circuit configurations are the same as those in FIG. 1 of the first embodiment.

Figure 6:
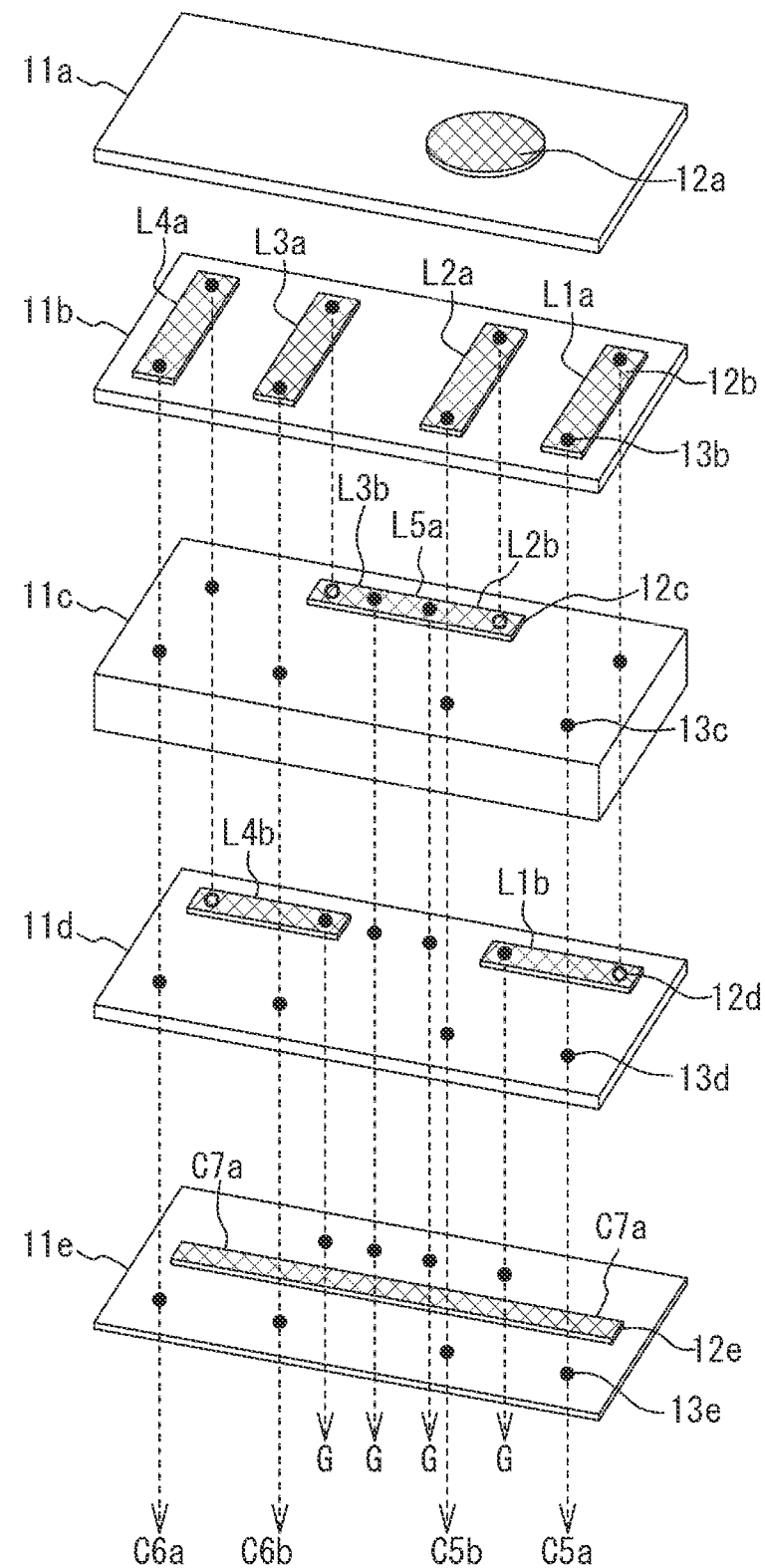
FIG. 6 is an exploded perspective view of dielectric layers in the first comparative example.
Figure 7:
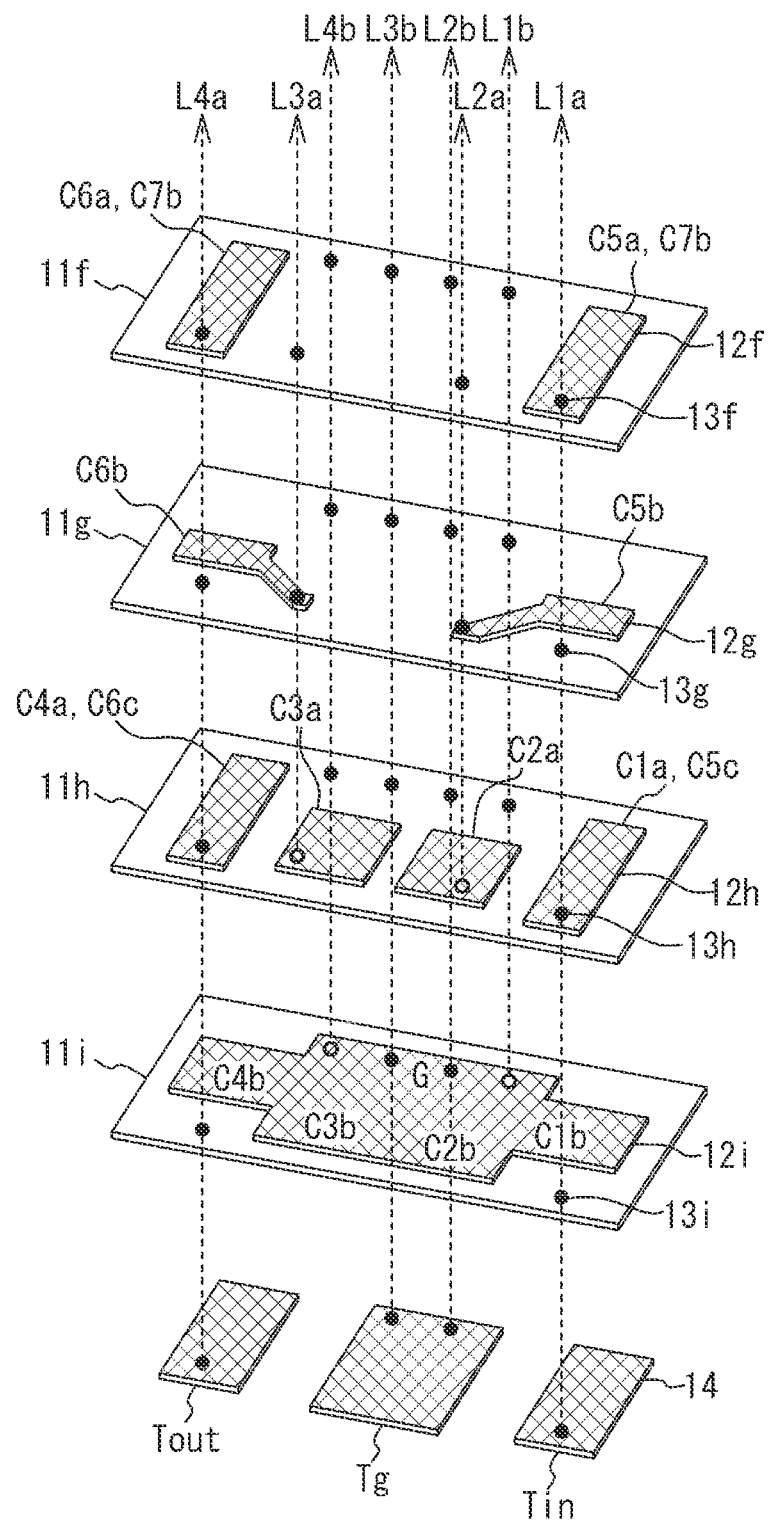
FIG. 7 is an exploded perspective view of the dielectric layers in the first comparative example.

FIG. 6 and FIG. 7 are exploded perspective views of dielectric layers in the first comparative example. As illustrated in FIG. 6 and FIG. 7, the line patterns L6a and L7a are not provided on the upper surface of the dielectric layer 11d. A first end of the line pattern L2a is electrically connected to the electrode C5b through the via wirings 13b to 13g, and is electrically connected to the electrode C2a. In this manner, the electrode C2a of the capacitor C2 is electrically connected to the electrode C5b corresponding to the node N2 not through any line pattern. Similarly, the electrode C3a of the capacitor C3 is electrically connected to the electrode C6b corresponding to the node N3 not through any line pattern. The via wiring 13i electrically connecting the ground pattern G formed by the conductor pattern 12i and the ground terminal Tg corresponds to the inductor L10. Other configurations are the same as those in FIG. 3 and FIG. 4 of the first embodiment.

Simulation 1

For the first embodiment and the first comparative example, a three dimensional electromagnetic field simulation was performed using a finite element method to calculate the transmission characteristics.

Each of the dielectric layers 11a to 11i contains $CaMgSi_2O_6$ as a main component. Since the frequencies handled by the filter 100 are as high as 1 GHz to 20 GHz, the filter 100 functions like a distributed constant circuit. Therefore, the capacitances of the capacitors C1 to C7 and the inductances of the inductors L1 to L7 are not determined. However, approximate values of the capacitances of the capacitors C1 to C7 and the inductances of the inductors L1 to L7 in the first embodiment are presented in Table 1.

TABLE 1

| Capacitance [pF] | | | | | | |
|---|---|---|---|---|---|---|
| C1 | C2 | C3 | C4 | C5 | C6 | C7 |
| 0.48 | 0.37 | 0.37 | 0.48 | 0.28 | 0.28 | 0.20 |
| Inductance [nH] | | | | | | |
| L1 | L2 | L3 | L4 | L5 | L6 | L7 |
| 1.8 | 3.0 | 3.0 | 1.8 | 0.1 | 0.1 | 0.1 |

Figure 8:
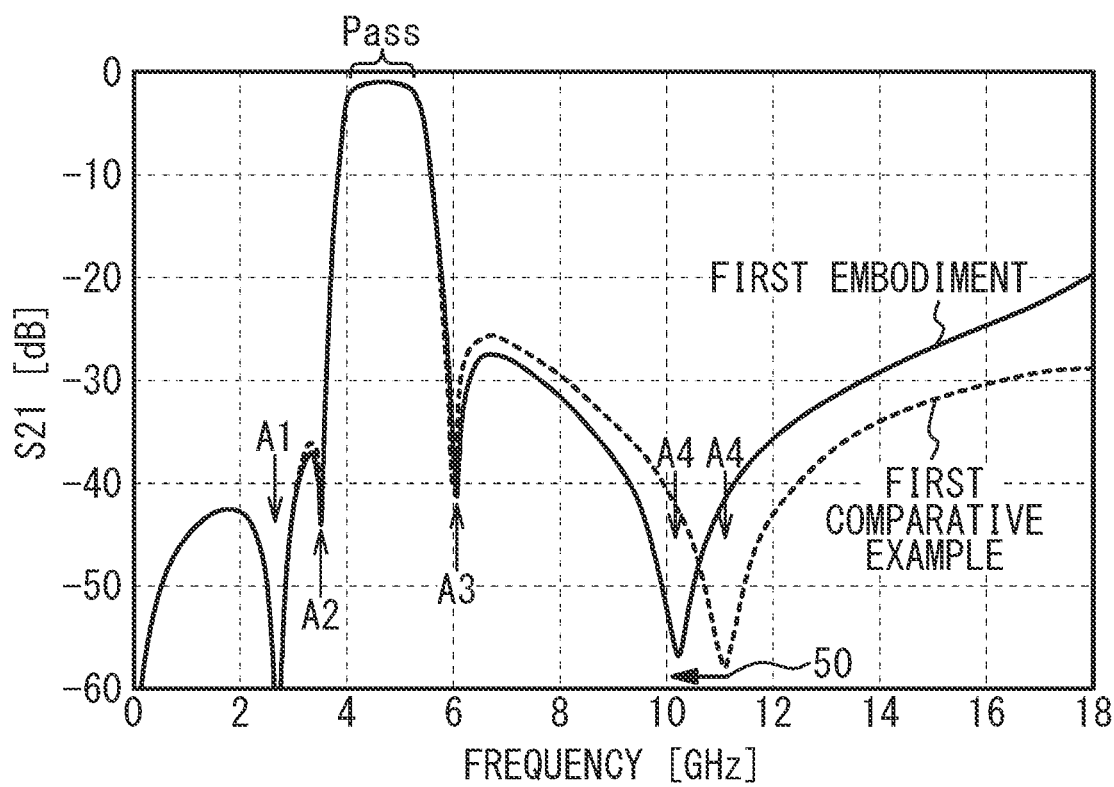
FIG. 8 illustrates transmission characteristics of the first embodiment and the first comparative example in a simulation 1.

FIG. 8 illustrates transmission characteristics of the first embodiment and the first comparative example in a simulation 1. As described above, the number of the via wirings 13i in the first comparative example is two, which is the same as that in the first embodiment. As illustrated in FIG. 8, the passband Pass is around 4.2 GHz to 5 GHz. The passband Pass is mainly formed by parallel resonance of the parallel resonance circuits R1 to R4. Four attenuation poles A1 to A4 are formed. The attenuation pole A1 at the lowest frequency and the attenuation pole A2 located at the low-frequency end of the passband Pass are mainly formed by parallel resonance between the capacitor C5 and the magnetic field coupling M1 and parallel resonance between the capacitor C6 and the magnetic field coupling M2. By providing the capacitor C7, the frequencies of the attenuation poles A1 and A2 are separated. The attenuation pole A3 located at the high-frequency end of the passband Pass is mainly formed by parallel resonance between the capacitor C7 and the inductor L5. The attenuation pole A4 at the highest frequency is mainly formed by series resonance between the capacitors C1 to C4 and inductances between the capacitors C1 to C4 and the ground terminal Tg.

The passband Pass and the attenuation poles A1 to A3 are almost the same between the first embodiment and the first comparative example. As indicated by an arrow 50, the frequency of the attenuation pole A4 is lower in the first embodiment than in the first comparative example. By providing the inductors L6 and L7 in this manner, the frequency of the attenuation poles A4 is changed. When the inductances of the inductors L6 and L7 are adjusted in the design stage, the attenuation pole A4 can be adjusted without changing the characteristics of the passband Pass and the attenuation poles A1 to A3.

Second Comparative Example

A filter in which one via wiring 13i electrically connecting the ground pattern G and the ground terminal Tg is provided in FIG. 6 is a second comparative example. In the second comparative example, the inductance of the inductor L10 is larger than that of the first comparative example.
Simulation 2

The transmission characteristics of the second comparative example were calculated. The simulation method is the same as that of the simulation 1. Table 2 presents approximate values of the capacitances and the inductances in the second comparative example.

TABLE 2

| Capacitance [pF] | | | | | | |
|---|---|---|---|---|---|---|
| C1 | C2 | C3 | C4 | C5 | C6 | C7 |
| 0.48 | 0.37 | 0.37 | 0.48 | 0.28 | 0.28 | 0.20 |
| Inductance [nH] | | | | | | |
| L1 | L2 | L3 | L4 | L5 | L10 | |
| 1.8 | 3.0 | 3.0 | 1.8 | 0.1 | 0.1 | |

As presented in Table 2, the capacitances of the capacitors C1 to C7 and the inductances of the inductors L1 to L5 are the same as those in the first embodiment. The inductance of the inductor L10 is 0.1 nH.

Figure 9:
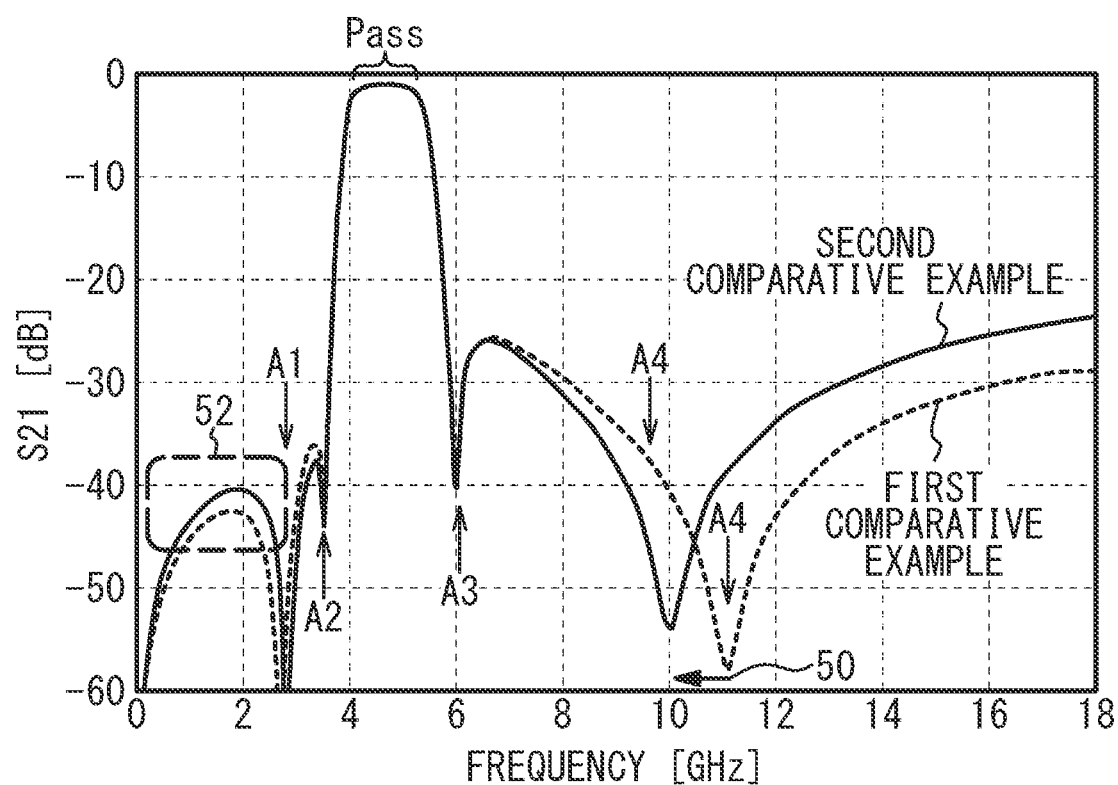
FIG. 9 illustrates transmission characteristics of a second comparative example and the first comparative example in a simulation 2.

FIG. 9 illustrates transmission characteristics of the second comparative example and the first comparative example in a simulation 2. In the second comparative example, the frequency of the attenuation pole A4 is shifted to a lower frequency than in the first comparative example as indicated by the arrow 50. The attenuation amount in a region 52 with frequencies lower than the attenuation pole A1 deteriorates. When the frequency of the attenuation pole A4 is adjusted by adjusting the inductance of the inductor L10 as in the simulation 2, the attenuation characteristics in the region 52 deteriorate.

Third Comparative Example

Figure 10:
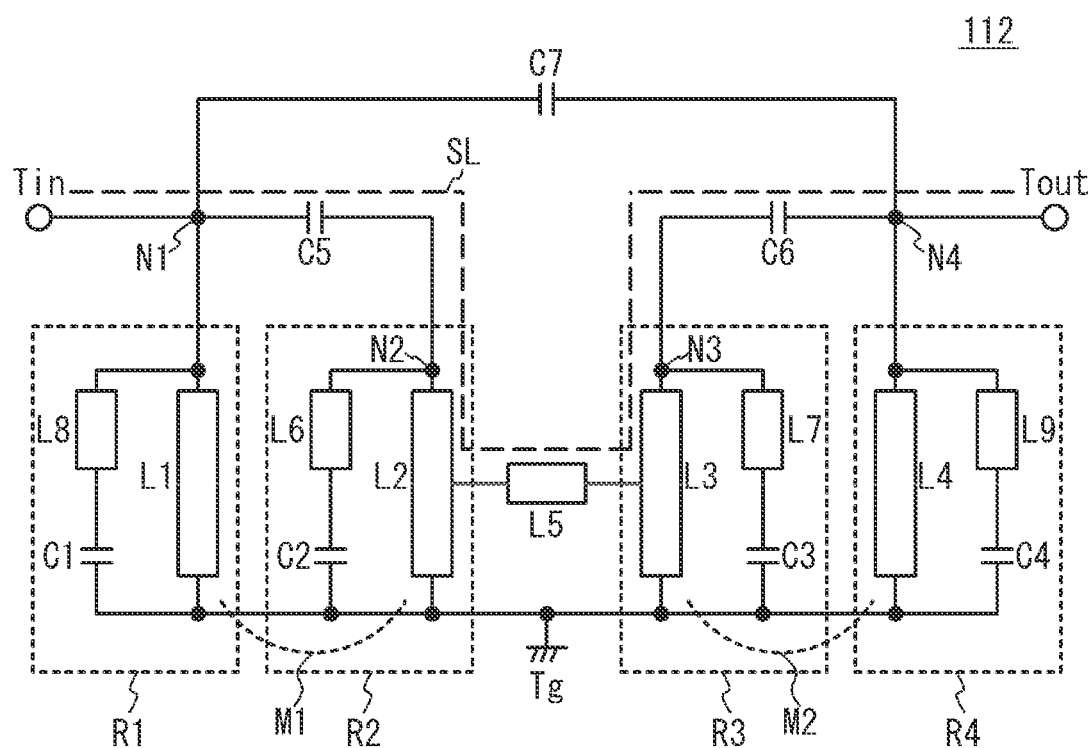
FIG. 10 is a circuit diagram of a filter in accordance with a third comparative example.

FIG. 10 is a circuit diagram of a filter in accordance with a third comparative example. As illustrated in FIG. 10, in a filter 112 of the third comparative example, inductors L8, L6, L7, and L9 connected in series with the capacitors C1 to C4, respectively, are provided in the parallel resonance circuits R1 to R4, respectively.

Figure 11:
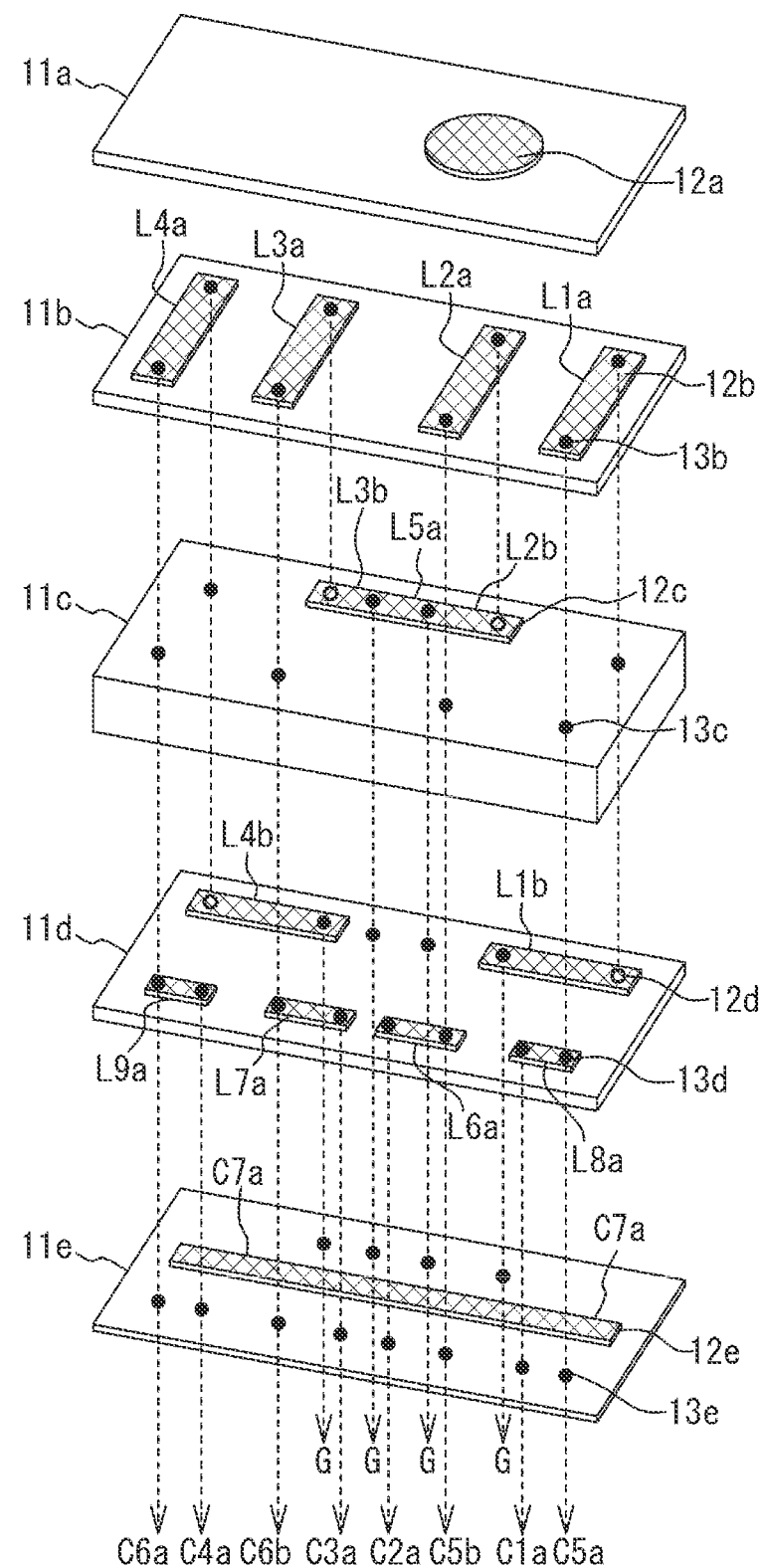
FIG. 11 is an exploded perspective view of dielectric layers in a third comparative example.
Figure 12:
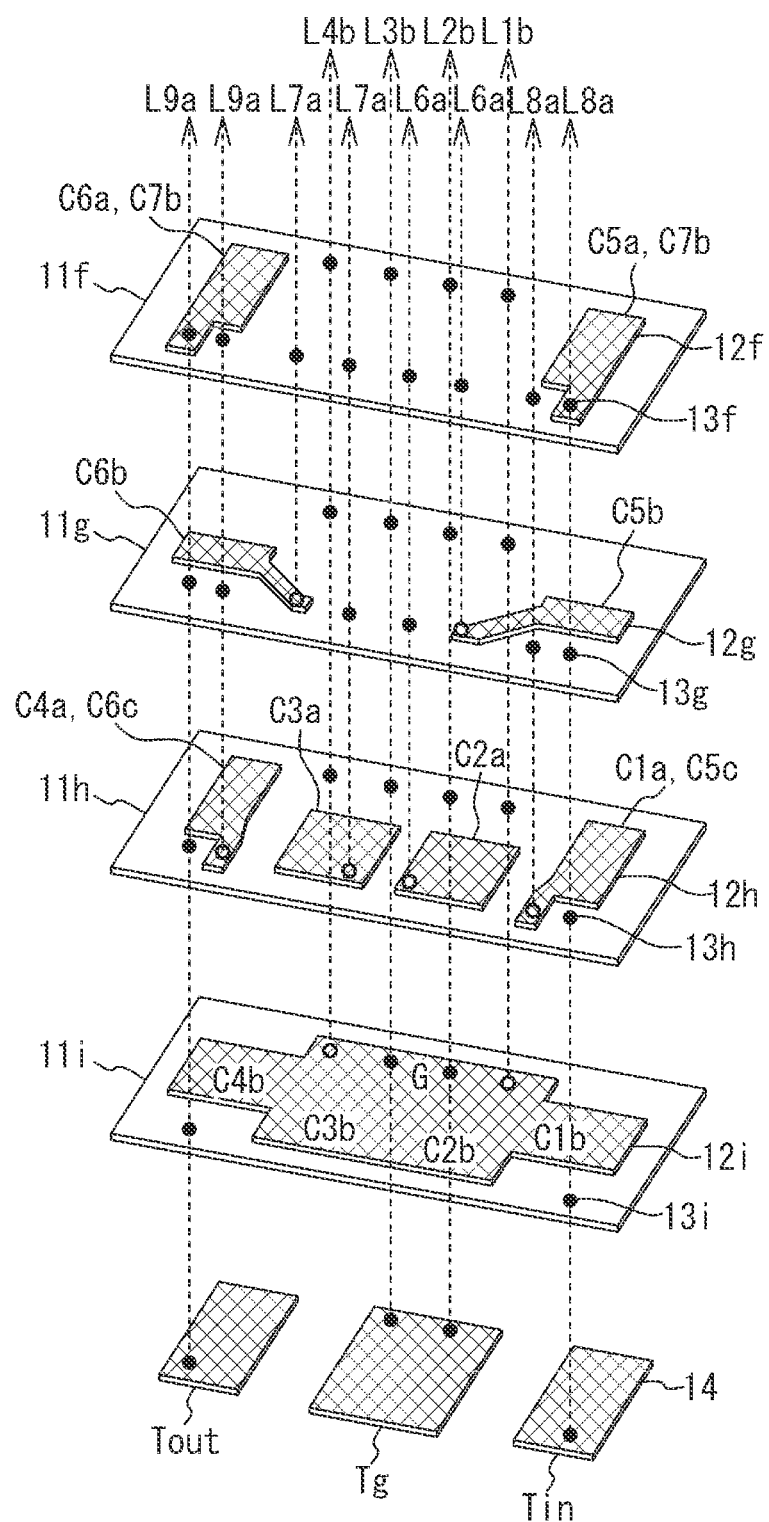
FIG. 12 is an exploded perspective view of the dielectric layers in the third comparative example.

FIG. 11 and FIG. 12 are exploded perspective views of dielectric layers in the third comparative example. As illustrated in FIG. 11 and FIG. 12, the line patterns L6a, L7a, L8a, and L9a are provided on the upper surface of the dielectric layer 11d. A first end of the line pattern L1a is electrically connected to the electrode C5a and the input terminal Tin through the via wirings 13b to 13i, and is electrically connected to the electrode C1a through the line pattern L8a. As described above, the electrode C1a of the capacitor C1 is electrically connected to the electrode C5a corresponding to the node N1 through the line pattern L8a. Similarly, the electrode C4a of the capacitor C4 is electrically connected to the electrode C6a corresponding to the node N4 through the line pattern L9a. Similarly to FIG. 3 and FIG. 4 of the first embodiment, the electrode C2a of the capacitor C2 is electrically connected to the electrode C5b corresponding to the node N2 through the line pattern L6a, and the electrode C3a of the capacitor C3 is electrically connected to the electrode C6b corresponding to the node N3 through the line pattern L7a. Other configurations are the same as those of the first embodiment.
Simulation 3

The transmission characteristics were calculated for the third comparative example. The simulation method is the same as that of the simulation 1. Table 3 presents approximate values of the capacitances and the inductances in the third comparative example.

TABLE 3

| Capacitance [pF] | | | | | | |
|---|---|---|---|---|---|---|
| C1 | C2 | C3 | C4 | C5 | C6 | C7 |
| 0.48 | 0.37 | 0.37 | 0.48 | 0.28 | 0.28 | 0.20 |
| Inductance [nH] | | | | | | | | |
| L1 | L2 | L3 | L4 | L5 | L6 | L7 | L8 | L9 |
| 1.8 | 3.0 | 3.0 | 1.8 | 0.1 | 0.1 | 0.1 | 0.1 | 0.1 |

As presented in Table 3, the capacitances of the capacitors C1 to C7 and the inductances of the inductors L1 to L7 are the same as those in the first embodiment. The inductances of the inductors L8 and L9 are the same as the inductances of the inductors L6 and L7.

Figure 13:
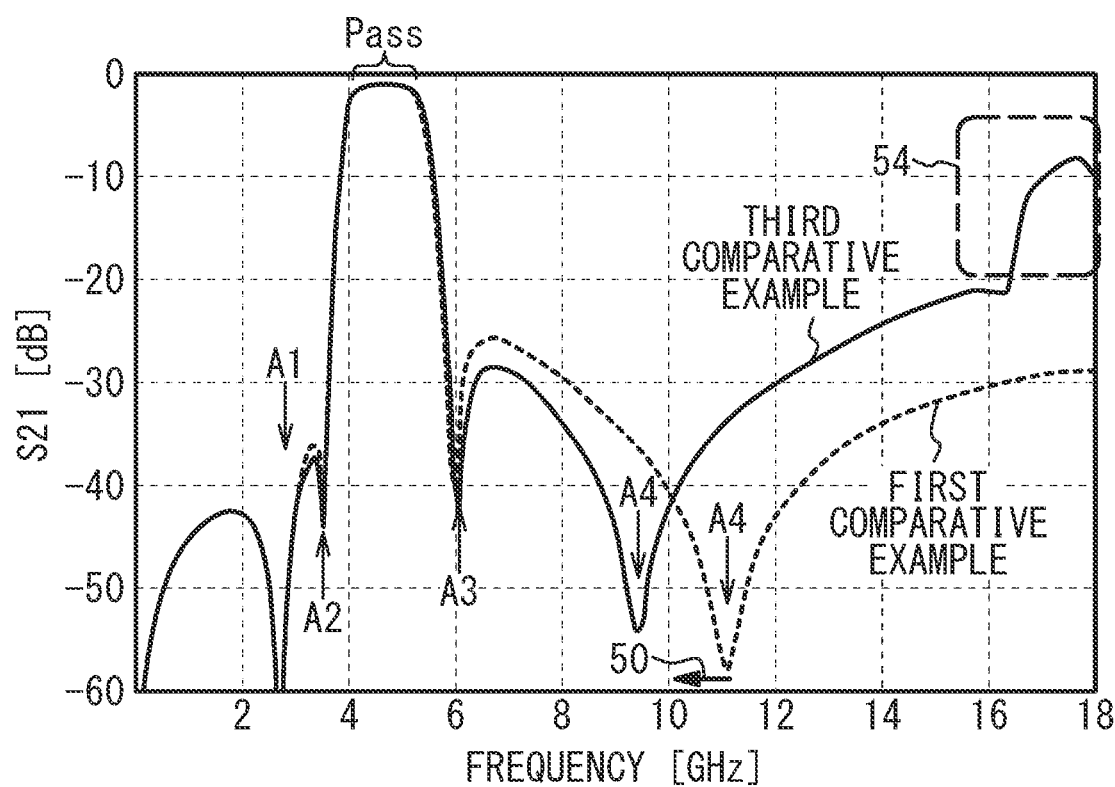
FIG. 13 illustrates transmission characteristics of the third comparative example and the first comparative example in a simulation 3.

FIG. 13 illustrates transmission characteristics of the third comparative example and the first comparative example in a simulation 3. In the third comparative example, the frequency of the attenuation pole A4 is shifted to a lower frequency than in the first comparative example as indicated by the arrow 50. The shift amount of the attenuation pole A4 in the third comparative example is larger than that in the first embodiment in FIG. 8. In the third comparative example, the attenuation characteristics in the region lower in frequency than the attenuation pole A1 are similar to those in the first comparative example. However, in the third comparative example, the attenuation amount in a region 54 higher than the 16 GHz is worse than that in the first comparative example. By providing the inductors L8 and L9 as in the simulation 3, it is possible to adjust the frequency of the attenuation pole A4 and to inhibit deterioration in the attenuation characteristics in the region 52, but the attenuation characteristics in the region 54 deteriorate.

Fourth Comparative Example

Figure 14:
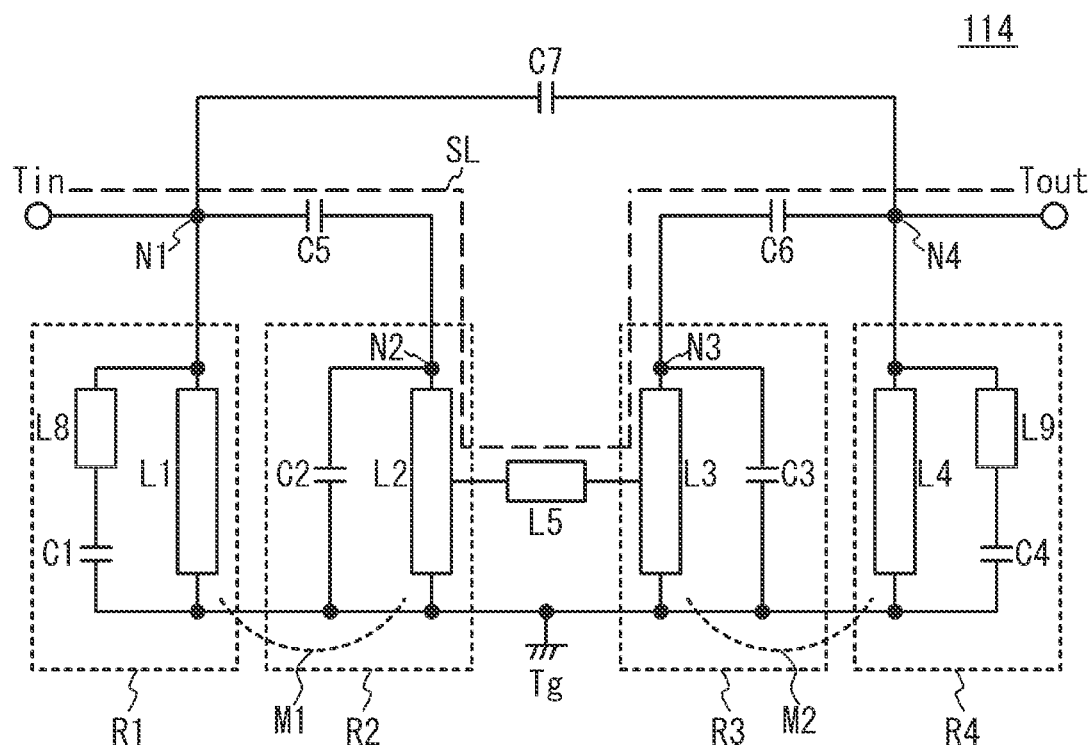
FIG. 14 is a circuit diagram of a filter in accordance with a fourth comparative example.

FIG. 14 is a circuit diagram of a filter in accordance with a fourth comparative example. As illustrated in FIG. 14, in a filter 114 of the fourth comparative example, the inductors L8 and L9 connected in series with the capacitors C1 and C4, respectively are provided in the parallel resonance circuits R1 and R4, respectively. In the parallel resonance circuits R2 and R3, inductors connected in series with the capacitors C2 and C3, respectively, are not provided.

Figure 15:
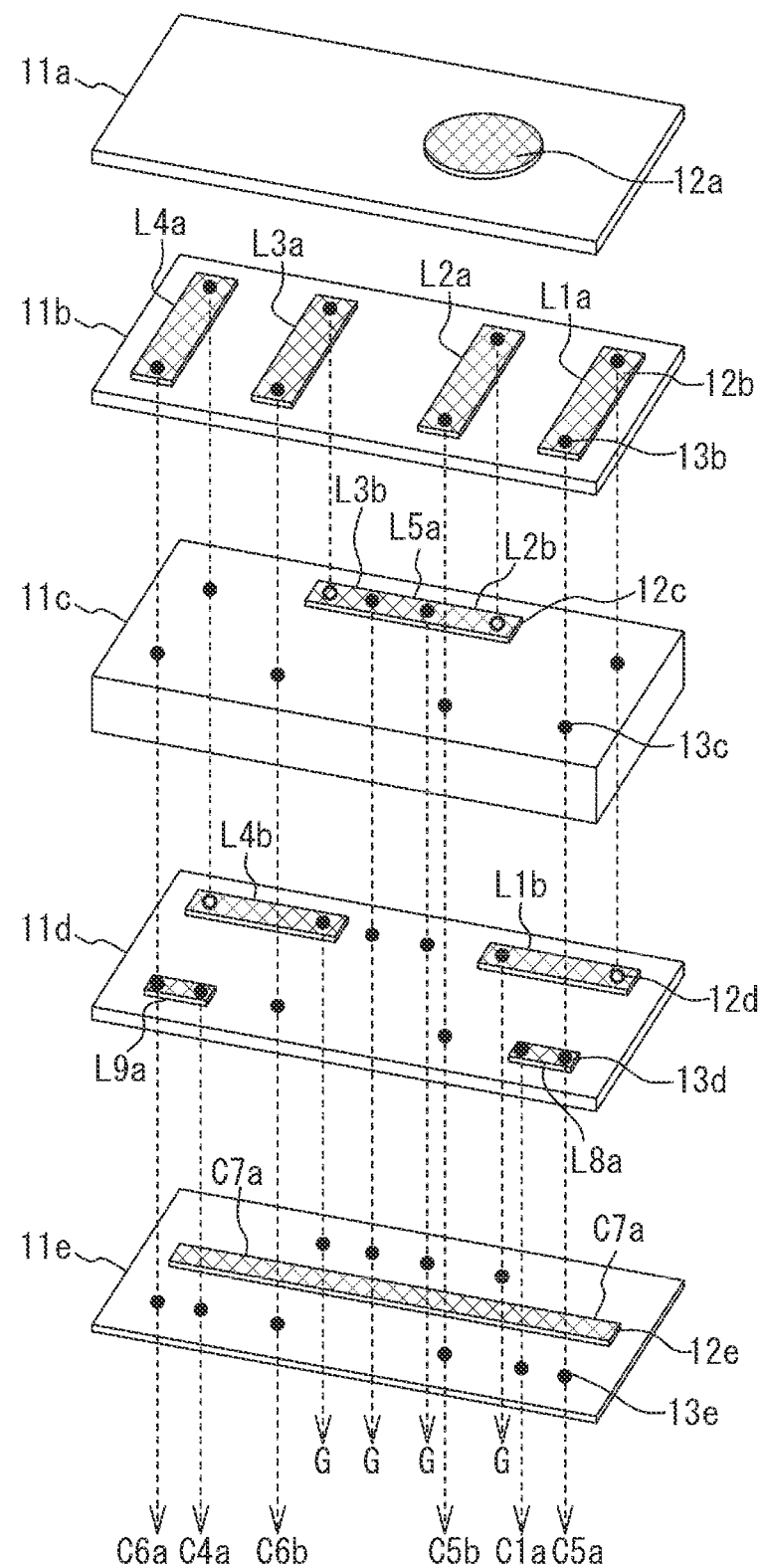
FIG. 15 is an exploded perspective view of dielectric layers in a fourth comparative example.
Figure 16:
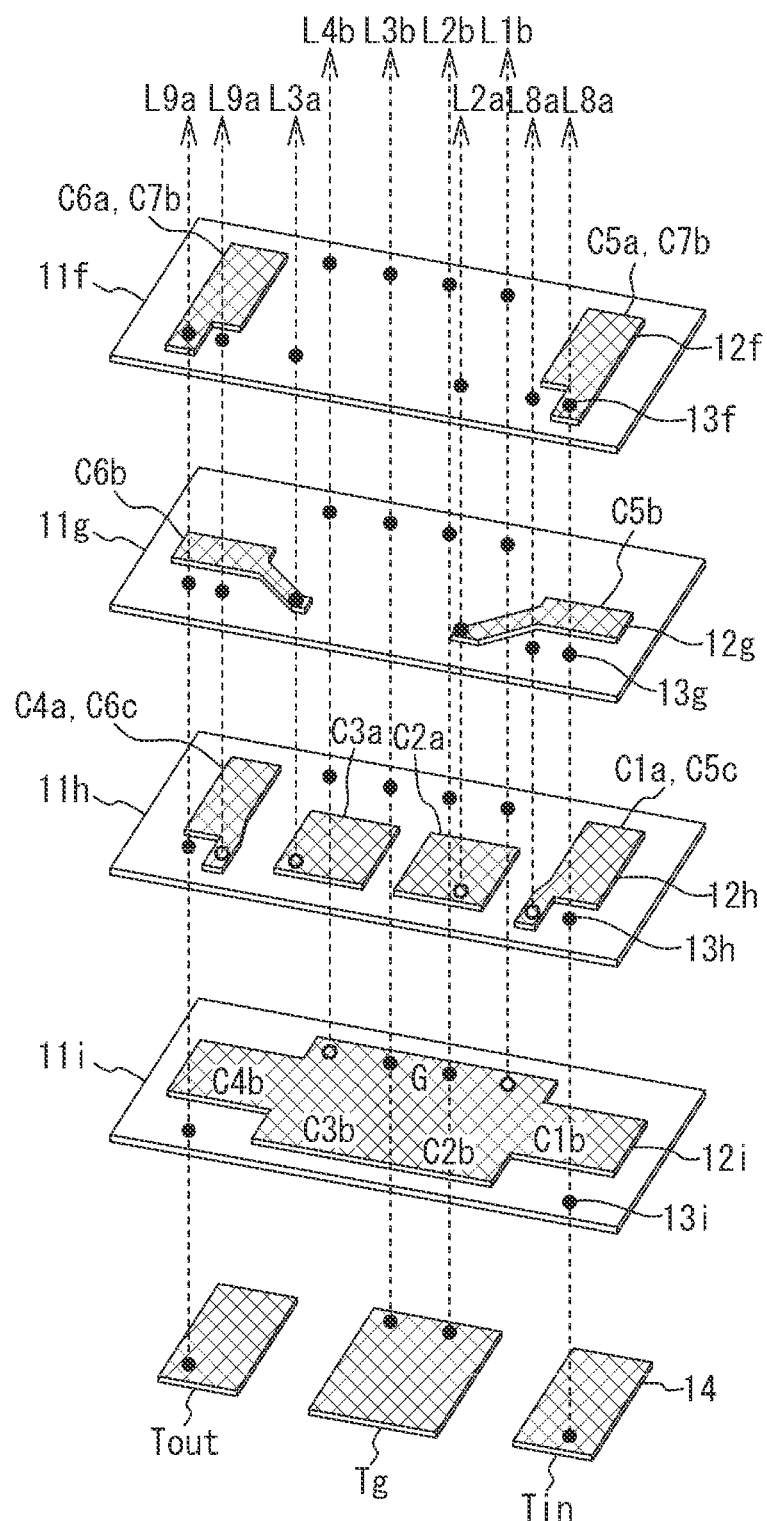
FIG. 16 is an exploded perspective view of the dielectric layers in the fourth comparative example.

FIGS. 15 and 16 are exploded perspective views of dielectric layers in the fourth comparative example. As illustrated in FIG. 15 and FIG. 16, the line patterns L8a and L9a are provided on the upper surface of the dielectric layer 11d, and the line patterns L6a and L7a are not provided. As in the third comparative example, the electrode C1a of the capacitor C1 is electrically connected to the electrode C5a corresponding to the node N1 through the line pattern L8a. The electrode C4a of the capacitor C4 is electrically connected to the electrode C6a corresponding to the node N4 through the line pattern L9a. Similarly to the first comparative example, the electrode C2a of the capacitor C2 is electrically connected to the electrode C5b corresponding to the node N2 not through any line pattern, and the electrode C3a of the capacitor C3 is electrically connected to the electrode C6b corresponding to the node N3 not through any line pattern. Other configurations are the same as those of the first embodiment.

Simulation 4

The transmission characteristics were calculated for the fourth comparative example. The simulation method is the same as that of the simulation 1. Table 4 presents approximate values of the capacitances and the inductances in the fourth comparative example.

TABLE 4

| Capacitance [pF] | | | | | | |
|---|---|---|---|---|---|---|
| C1 | C2 | C3 | C4 | C5 | C6 | C7 |
| 0.48 | 0.37 | 0.37 | 0.48 | 0.28 | 0.28 | 0.20 |

| Inductance [nH] | | | | | | |
|---|---|---|---|---|---|---|
| L1 | L2 | L3 | L4 | L5 | L8 | L9 |
| 1.8 | 3.0 | 3.0 | 1.8 | 0.1 | 0.1 | 0.1 |

As presented in Table 4, the capacitances of the capacitors C1 to C7 and the inductances of the inductors L1 to L5 are the same as those in the first embodiment. The inductances of the inductors L8 and L9 are the same as those in the third comparative example.

Figure 17:
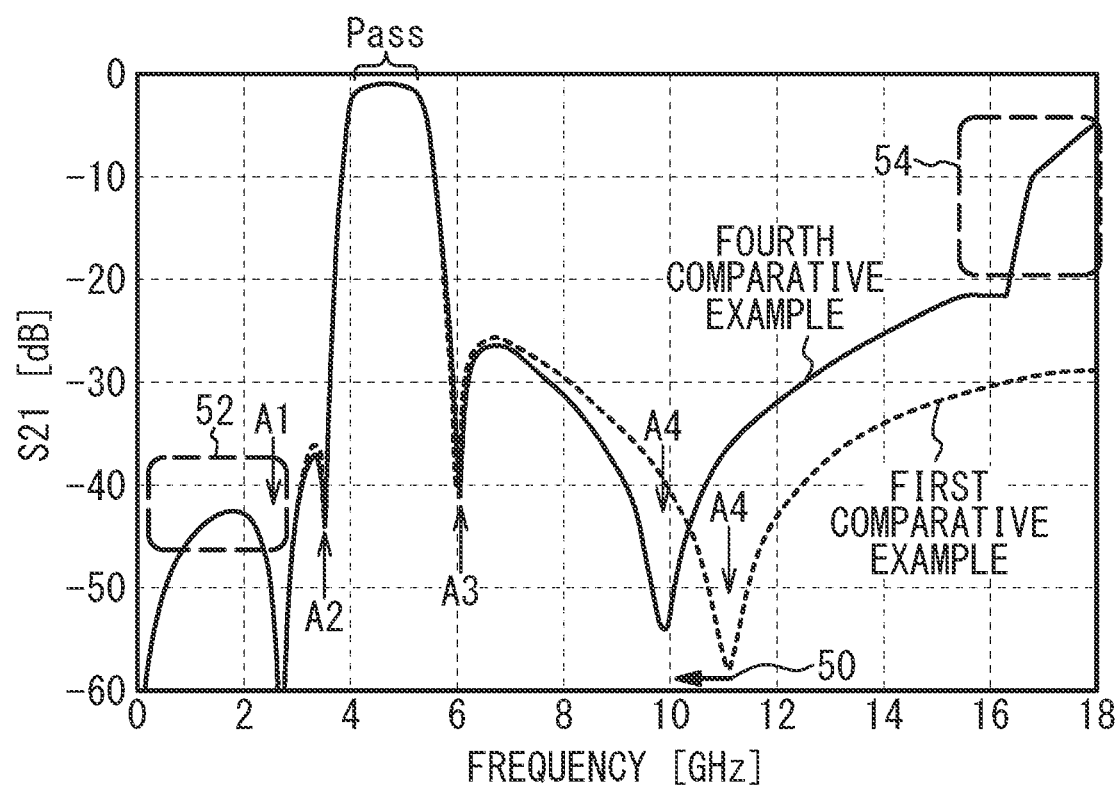
FIG. 17 illustrates transmission characteristics of the fourth comparative example and the first comparative example in a simulation 4.

FIG. 17 illustrates transmission characteristics of the fourth comparative example and the first comparative example in a simulation 4. In the fourth comparative example, the frequency of the attenuation pole A4 is shifted to a lower frequency than in the first comparative example as indicated by the arrow 50. The shift amount of the attenuation pole A4 in the fourth comparative example is about the same as that in the first embodiment in FIG. 8. In the fourth comparative example, the attenuation characteristics in the region 52 lower in frequency than attenuation pole A1 are approximately the same as those in the first comparative example. In the fourth comparative example, the attenuation amount in the region 54 higher than 16 GHz is worse than that in the first comparative example. By providing the inductors L8 and L9 as in the simulation 4, it is possible to adjust the frequency of the attenuation pole A4 and to inhibit deterioration in the attenuation characteristics in the region 52, but the attenuation characteristics in the region 54 deteriorate. The deterioration in the attenuation characteristics in the region 54 is similar to that in the third comparative example of FIG. 13.

First Variation of the First Embodiment

Figure 18:
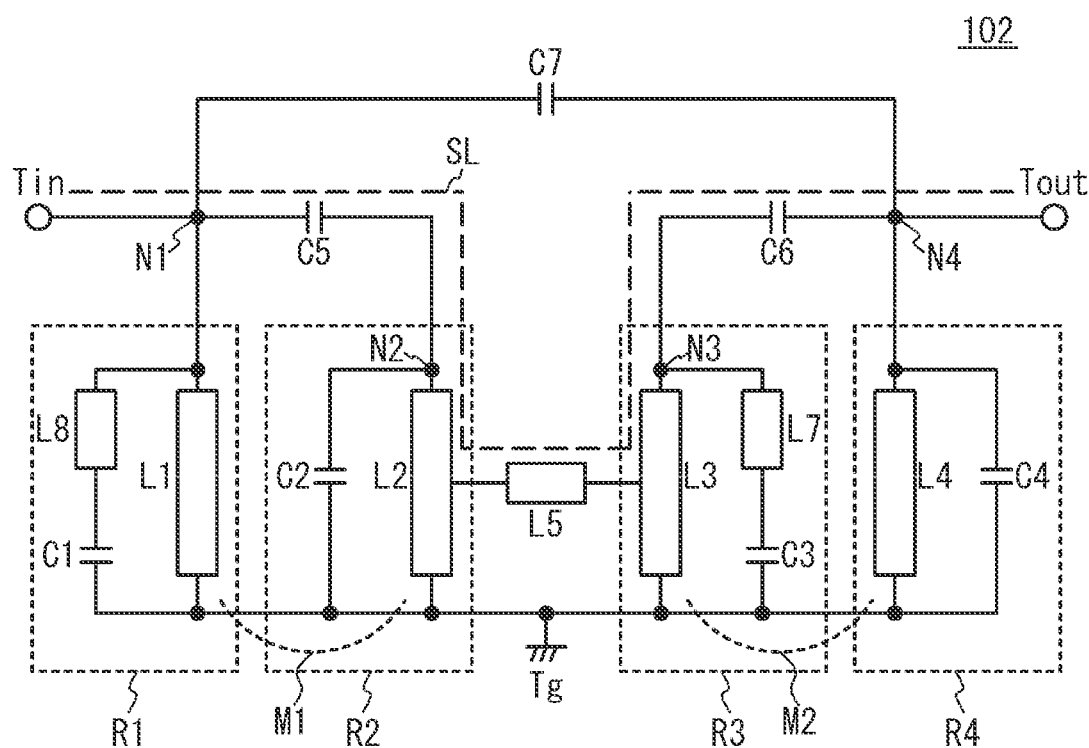
FIG. 18 is a circuit diagram of a filter in accordance with a first variation of the first embodiment.

FIG. 18 is a circuit diagram of a filter in accordance with a first variation of the first embodiment. As illustrated in FIG. 18, in a filter 102 in accordance with the first variation of the first embodiment, the inductors L8 and L7 connected in series with the capacitors C1 and C3, respectively, are provided in the parallel resonance circuits R1 and R3, respectively. In the parallel resonance circuits R2 and R4, inductors connected in series with the capacitors C2 and C4, respectively, are not provided.

Figure 19:
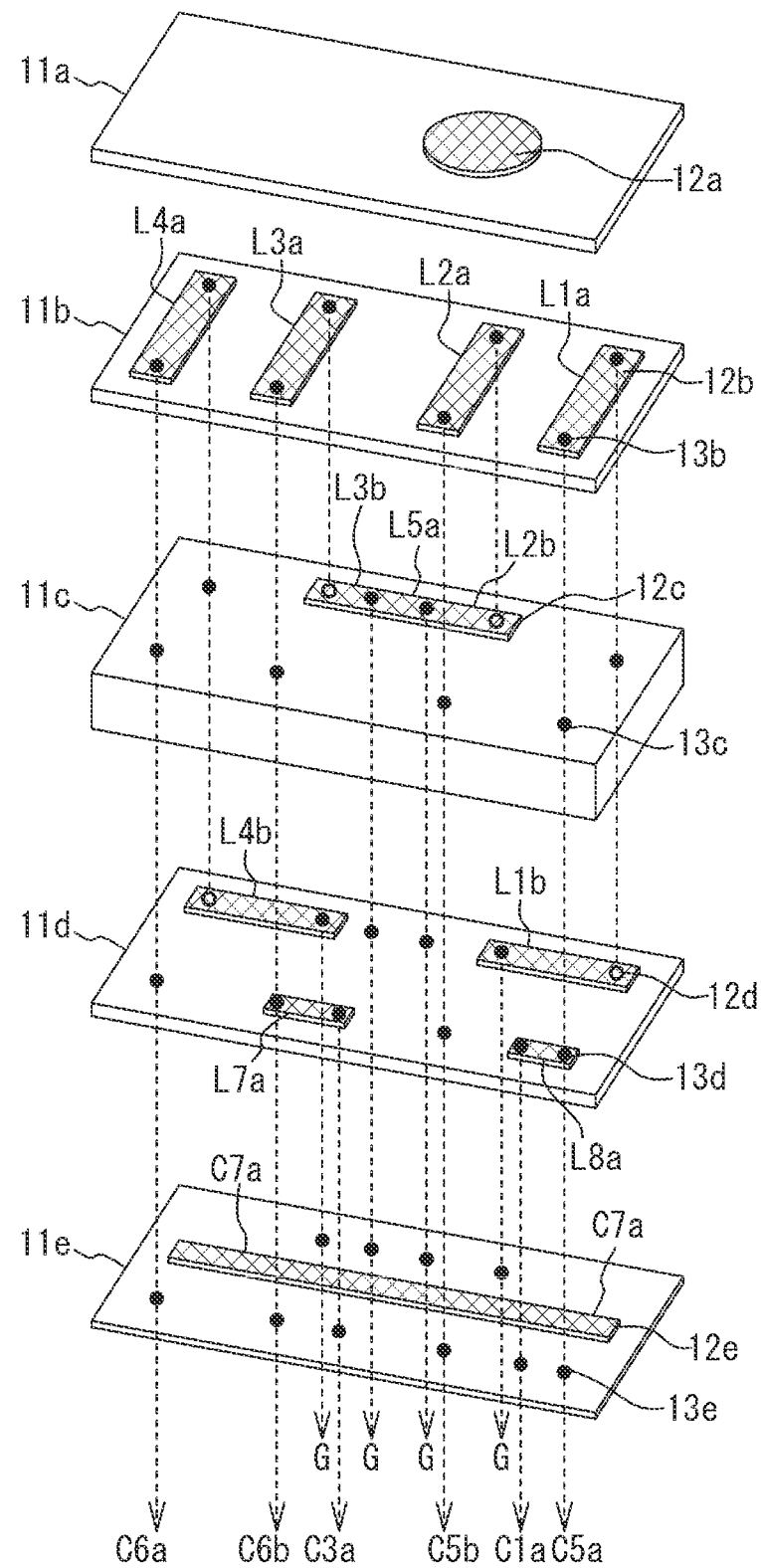
FIG. 19 is an exploded perspective view of dielectric layers in accordance with the first variation of the first embodiment.
Figure 20:
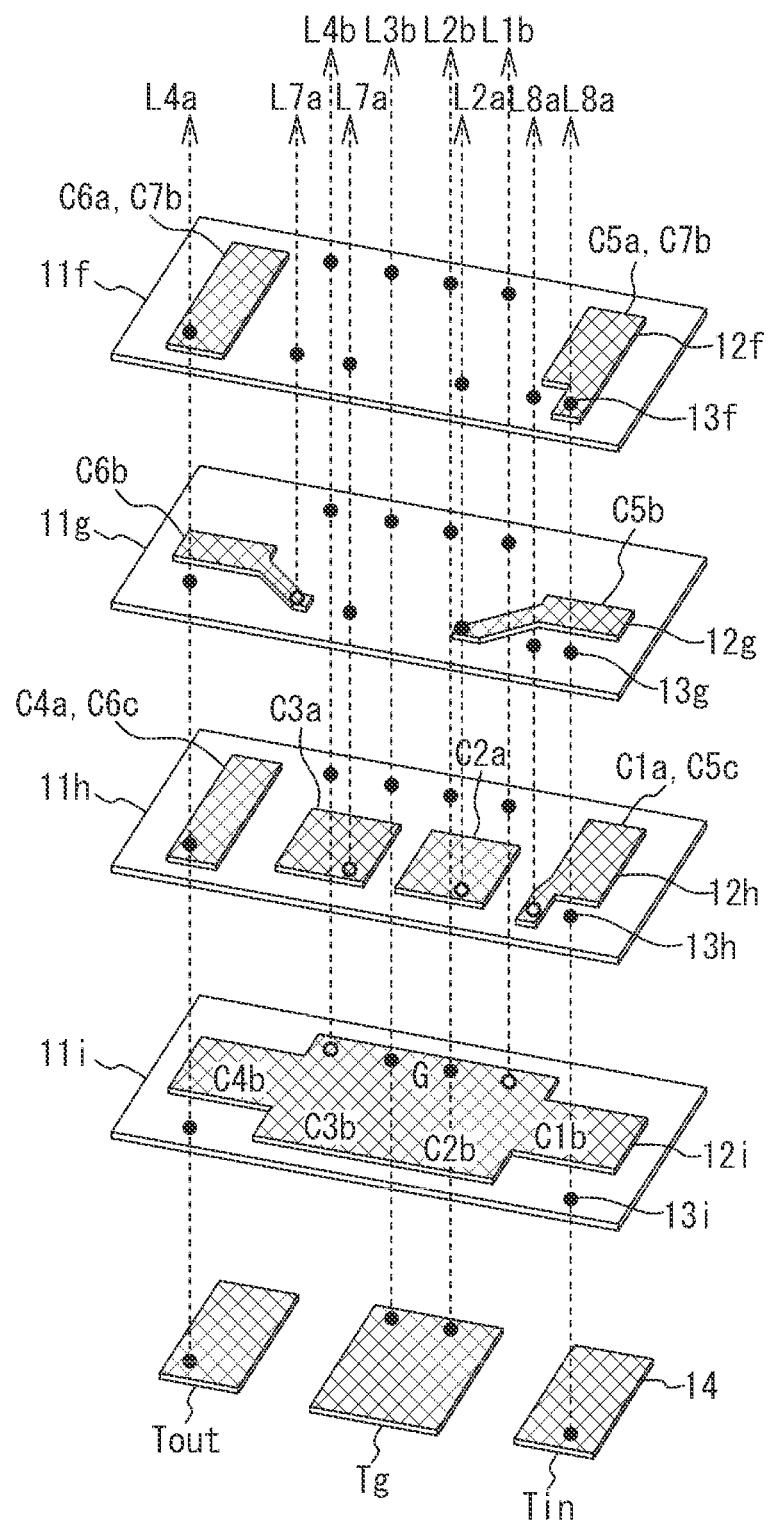
FIG. 20 is an exploded perspective view of the dielectric layers in accordance with the first variation of the first embodiment.

FIG. 19 and FIG. 20 are exploded perspective views of dielectric layers in accordance with the first variation of the first embodiment. As illustrated in FIG. 19 and FIG. 20, the line patterns L7a and L8a are provided on the upper surface of the dielectric layer 11d, and the line patterns L6a and L9a are not provided. As in the third comparative example, the electrode C1a of the capacitor C1 is electrically connected to the electrode C5a corresponding to the node N1 through the line pattern L8a. The electrode C3a of the capacitor C3 is electrically connected to the electrode C6b corresponding to the node N3 through the line pattern L7a. As in the first comparative example, the electrode C2a of the capacitor C2 is electrically connected to the electrode C5b corresponding to the node N2 not through any line pattern. The electrode C4a of the capacitor C4 is electrically connected to the electrode C6a corresponding to the node N4 not through any line pattern, and other configurations are the same as those of the first embodiment.

Simulation 5

The transmission characteristics of the first variation of the first embodiment were calculated. The simulation method is the same as that of the simulation 1. Table 5 presents approximate values of the capacitances and the inductances in the first variation of the first embodiment.

TABLE 5

| Capacitance [pF] | | | | | | |
|---|---|---|---|---|---|---|
| C1 | C2 | C3 | C4 | C5 | C6 | C7 |
| 0.48 | 0.37 | 0.37 | 0.48 | 0.28 | 0.28 | 0.20 |

| Inductance [nH] | | | | | | |
|---|---|---|---|---|---|---|
| L1 | L2 | L3 | L4 | L5 | L7 | L8 |
| 1.8 | 3.0 | 3.0 | 1.8 | 0.1 | 0.1 | 0.1 |

As presented in Table 5, the capacitances of the capacitors C1 to C7 and the inductances of the inductors L1 to L5 are the same as those in the first embodiment. The inductances of the inductors L7 and L8 are the same as those in the third comparative example.

Figure 21:
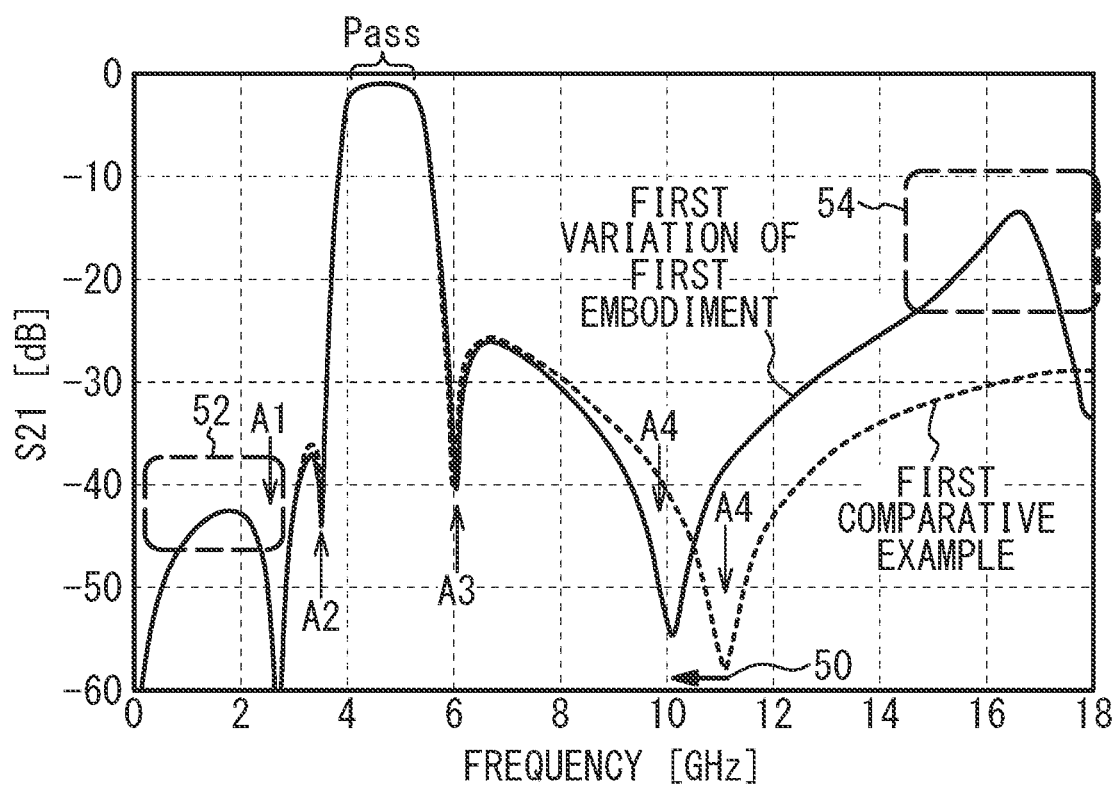
FIG. 21 illustrates transmission characteristics of the first variation of the first embodiment and the first comparative example in a simulation 5.

FIG. 21 illustrates transmission characteristics of the first variation of the first embodiment and the first comparative example in a simulation 5. In the first variation of the first embodiment, the frequency of the attenuation pole A4 is shifted to a lower frequency than in the first comparative example as indicated by the arrow 50. The shift amount of the attenuation pole A4 in the first variation of the first embodiment is substantially the same as that in the first embodiment in FIG. 8. In the first variation of the first embodiment, the attenuation characteristics in the region 52 lower in frequency than the attenuation pole A4 are similar to those in the first comparative example. In the first variation of the first embodiment, the attenuation amount in the region 54 higher than 16 GHz is worse than in the first comparative example. By providing the inductors L7 and L8 as in the simulation 5, it is possible to adjust the frequency of the attenuation pole A4 and to inhibit deterioration in the attenuation characteristics in the region 52, but the attenuation characteristics in the region 54 deteriorate. The deterioration in the attenuation characteristic in the region 54 is slightly smaller than that in the third comparative example of FIG. 13 and that in the fourth comparative example of FIG. 17. As described above, in the first variation of the first embodiment, deterioration in the attenuation characteristics in the region 54 can be inhibited more than in the third and fourth comparative examples.

To summarize the simulations 1 to 5, by providing the inductors L6 to L9 connected in series with the capacitors C1 to C4 in at least one of the parallel resonance circuits R1 to R4, and by adjusting the inductances of the inductors L6 to L9 in the design stage, it is possible to adjust the frequency of the attenuation pole in the region 52 without changing the attenuation characteristics in the region 52. The shift amount of the attenuation pole A4 increases as the number of the inductors L6 to L9 increases. By providing neither of the inductors L8 and L9 in at least one of the parallel resonance circuit R1 directly connected to the input terminal Tin or the parallel resonance circuit R4 directly connected to the output terminal Tout, it is possible to reduce a change in attenuation characteristics in the region 54. By providing neither of the inductors L8 and L9 in both of the parallel resonance circuits R1 and R4, it is possible to further reduce a change in attenuation characteristics in the region 54.

In the first embodiment and the first variation thereof, the parallel resonance circuit R4 (a first resonance circuit) includes the capacitor C4 (a first capacitor) and the inductor L4 (a first inductor) that are connected in parallel between a ground terminal and the node N4 (a first node) electrically connected to the output terminal Tout (a first signal terminal) not through any capacitor. The inductor L9 is not connected in series with the capacitor C4 between the node N4 and the ground terminal Tg. The parallel resonance circuit R1 (a second resonance circuit) includes the capacitor C1 (a second capacitor) and the inductor L1 (a second inductor) that are connected in parallel between the ground terminal Tg and the node N1 (a second node) electrically connected to the input terminal Tin (a second signal node) not through any capacitor. The parallel resonance circuit R3 (a third resonance circuit) includes the capacitor C3 (a third capacitor) and the inductor L3 (a third inductor) that are connected in parallel between the ground terminal Tg and the node N3 (a third node) located in the path SL through which a high-frequency signal can be transmitted between the nodes N4 and N1, and the inductor L7 (a first series inductor) that is connected in series with the capacitor C3 between the node N3 and the ground terminal Tg.

By providing the inductor L7, it is possible to inhibit a change in attenuation characteristics in the region 52 and to easily adjust the frequency of the attenuation pole A4. By not providing the inductor L9 in the parallel resonance circuit R4, it is possible to reduce a change in attenuation characteristics in the region 54 as illustrated in FIG. 8 and FIG. 21.

Unlike the first embodiment, in the parallel resonance circuit R1, the inductor L8 is not connected in series with the capacitor C1 between the node N1 and the ground terminal Tg. Thereby, as illustrated in FIG. 8, it is possible to further reduce a change in attenuation characteristics in the region 54.

The first embodiment has described an example in which the inductor L8 is provided in the parallel resonance circuit R1 and the inductor L9 is not provided in the parallel resonance circuit R4. However, the inductor L8 may not be necessarily provided in the parallel resonance circuit R1 and the inductor L9 may be provided in the parallel resonance circuit R4.

As illustrated in FIG. 3, FIG. 4, FIG. 19, and FIG. 20, a plurality of the dielectric layers 11a to 11i are stacked. The inductor L7 includes a line pattern L7a (a first line pattern) provided on a first surface between the adjacent dielectric layers 11c and 11d. The parallel resonance circuit R4 is connected in series with the capacitor C4 between the node N4 and the ground terminal Tg, and does not include any line patterns provided on the surfaces between respective two of the dielectric layers 11a to 11i. This configuration allows to provide the inductor L7 and not to provide the inductor L9.

The inductor L3 includes the line pattern L3a (a second line pattern) provided on a second surface that is located between the adjacent dielectric layers 11a and 11b and is different from the first surface. The line pattern L3a is electrically connected to the line pattern L7a through the via wirings 13b to 13c that penetrate through the dielectric layers 11b to 11c, respectively. In this case, when the line patterns L3a and L7a are magnetic-field-coupled, the resonance characteristics of the parallel resonance circuit R3 change. Therefore, the direction in which the line pattern L3a extends and the direction in which the line pattern L7a extends preferably intersect each other when viewed from the thickness direction of the multilayer body 10. The angle between the direction in which the line pattern L3a extends and the direction in which the line pattern L7a extends is preferably 450 or greater and 135° or less, more preferably 800 or greater and 100° or less, and further preferably substantially 900 (that is, substantially orthogonal). The same applies to the line patterns L2a and L6a.

When the line patterns of the inductors L1 to L9 and the ground pattern on the mounting substrate on which the filter is to be mounted are close to each other, the Q factors of the inductors L1 to L9 decrease because of eddy-current loss or the like. Therefore, electrodes forming the capacitors C1 to C7 are provided between the line patterns forming the inductors L1 to L9 and the terminals 14. This configuration improves the Q factors of the inductors L1 to L9. In particular, the Q factors of the inductors L1 to L4 forming the parallel resonance circuits R1 to R4 are preferably high. Therefore, the line patterns L6a (and L7a) are preferably formed by conductor patterns between the longest line patterns L2a (and L3a) among the line patterns forming the inductors L2 (and L3) and the electrodes forming the capacitors C1 to C7.

At least one inductor of the inductors L1 to L4 includes the line patterns L1b and L4b (third line patterns) provided on the first surface. This configuration inhibits increase in the size of the filter.

The parallel resonance circuit R2 (a fourth resonance circuit) includes the capacitor C2 (a fourth capacitor) and the inductor L2 (a fourth inductor) that are connected in parallel between the node N2 (a fourth node) located between the nodes N3 and N1 in the path SL and the ground terminal Tg, and the inductor L6 (a second series inductor) that is connected in series with the capacitor C2 between the node N2 and the ground terminal Tg. Thus, the frequency of the attenuation pole A4 can be adjusted by adjusting the inductances of the inductors L6 and L7. In addition, since the number of inductors is increased, the shift amount of the attenuation pole A4 can be increased. Therefore, the adjustment range of the frequency of the attenuation pole A1 can be increased.

The nodes N4 and N3 are electrically connected through the capacitor C6 (a fifth capacitor), and the nodes N1 and N3 are electrically connected through the capacitor C5 (a sixth capacitor). The inductor L7 is provided in the parallel resonance circuit R3 provided between the ground terminal Tg and the node N3 electrically connected to both input and output terminals Tin and Tout through the capacitors C5 and C6. Thus, changes in the attenuation characteristics in the regions 52 and 54 can be inhibited, and the frequency of the attenuation pole A4 can be easily adjusted.

In the first embodiment and the variation thereof, an example in which the inductor L6 is electrically connected between the node N2 and the capacitor C2 and the inductor L7 is electrically connected between the node N3 and the capacitor C3 has been described. The inductor L6 may be electrically connected between the ground terminal Tg and the capacitor C2, and the inductor L7 may be electrically connected between the ground terminal Tg and the capacitor C3.

The filters 100 and 102 are bandpass filters. The capacitors C1 to C4 and the inductance components between the capacitors C1 to C4 and the ground terminal Tg form the attenuation pole A4 at a frequency higher than the passband Pass of the filter. Thus, the frequency of the attenuation pole A4 can be adjusted by adjusting the inductances of the inductors L6 and L7.

Second Variation of the First Embodiment

Figure 22:
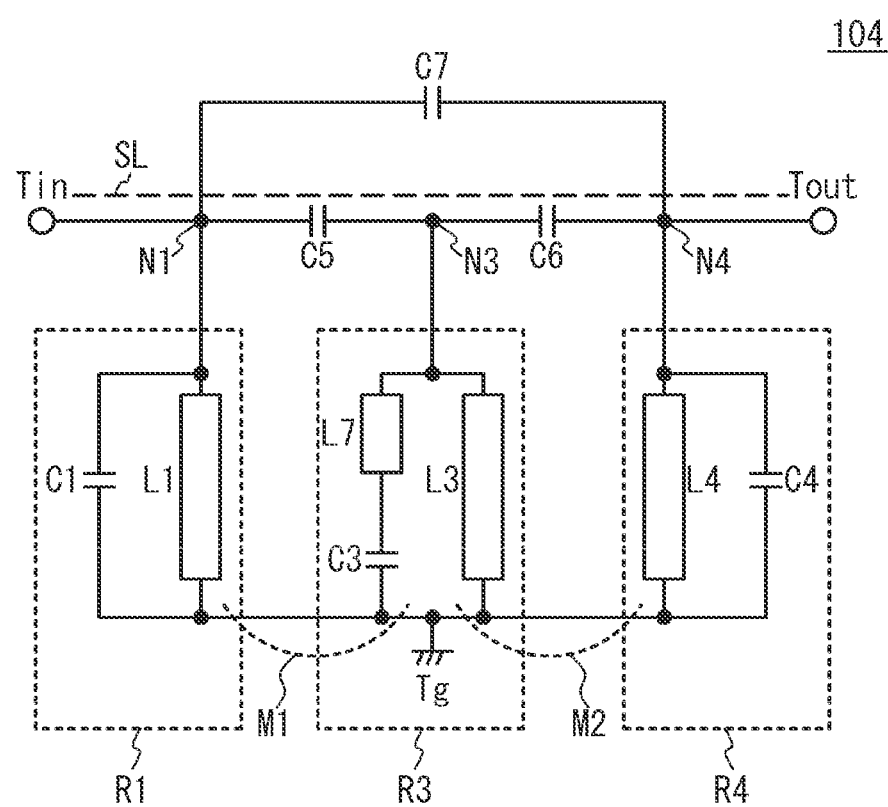
FIG. 22 is a circuit diagram of a filter in accordance with a second variation of the first embodiment.

FIG. 22 is a circuit diagram of a filter in accordance with a second variation of the first embodiment. As illustrated in FIG. 22, the parallel resonance circuit R2 is not provided in a filter 104 in accordance with the second variation of the first embodiment. The nodes N1 and N3 are electrically connected to each other through the capacitor C5. The path SL through which the high-frequency signal is transmitted extends from the node N1 to the node N4 through the capacitors C5 and C6. The parallel resonance circuit R3 includes the inductor L6, and the parallel resonance circuits R1 and R4 do not include the inductor L8 or L9. Other circuit configurations are the same as those in the first embodiment, and a description thereof is omitted.

Table 6 presents examples of the capacitances of the capacitors C1 and C3 to C7 and the inductances of the inductors L1, L3, L4, and L7 in the second variation of the first embodiment.

TABLE 6

| Capacitance [pF] | | | | | |
|---|---|---|---|---|---|
| C1 | C3 | C4 | C5 | C6 | C7 |
| 0.5 | 0.6 | 0.5 | 1.1 | 1.1 | 0.1 |

| Inductance [nH] | | | |
|---|---|---|---|
| L1 | L3 | L4 | L7 |
| 1.1 | 0.8 | 1.1 | 0.1 |

By setting the values of the elements as presented in Table 6, a bandpass filter can be formed. Although three or four parallel resonance circuits R1 to R4 have been described, a plurality of parallel resonators may be connected to different positions in the path SL. Two adjacent nodes of the nodes N1 to N4 may be connected through a capacitor, such as the nodes N1 and N2 and the nodes N3 and N4 in the first embodiment and the first variation thereof, or the nodes N1 and N3 and the nodes N3 and N4 as in the second variation of the first embodiment. The adjacent nodes may be connected to each other through an inductor, such as the nodes N2 and N3 in the first embodiment and the first variation thereof. The adjacent nodes may be connected by magnetic field coupling.

Second Embodiment

Figure 23:
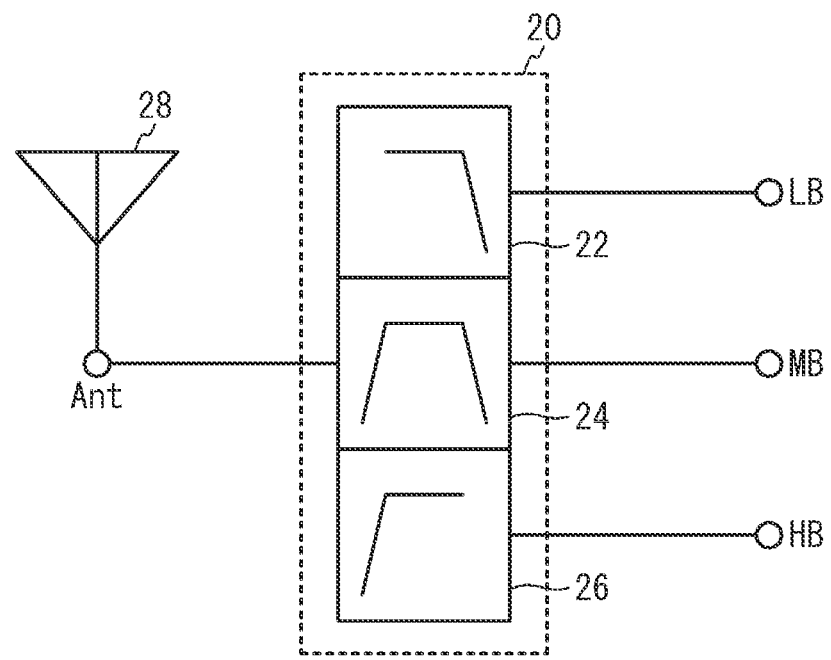
FIG. 23 is a circuit diagram of a triplexer in accordance with a second embodiment.

FIG. 23 is a circuit diagram of a triplexer in accordance with a second embodiment. As illustrated in FIG. 23, a triplexer 20 includes filters 22, 24 and 26. The filters 22, 24 and 26 are connected between a common terminal Ant and terminals LB, MB and HB, respectively. An antenna 28 is connected to the common terminal Ant. The filter 22 is, for example, a low-pass filter LPF, and transmits high-frequency signals in a low band and suppresses signals with other frequencies. The filter 24 is, for example, a bandpass filter BPF, and transmits high-frequency signals in a middle band higher in frequency than the low band and suppresses signals with other frequencies. The filter 26 is, for example, a high-pass filter HPF, and transmits high-frequency signals in a high band higher in frequency than the middle band, and suppresses signals with other frequencies.

At least one of the filters 22, 24, and 26 may be the filter according to any one of the first embodiment and its variations. Although a triplexer has been described as an example of the multiplexer, the multiplexer may be a diplexer, a duplexer, or a quadplexer.

First Variation of the Second Embodiment

Figure 24:
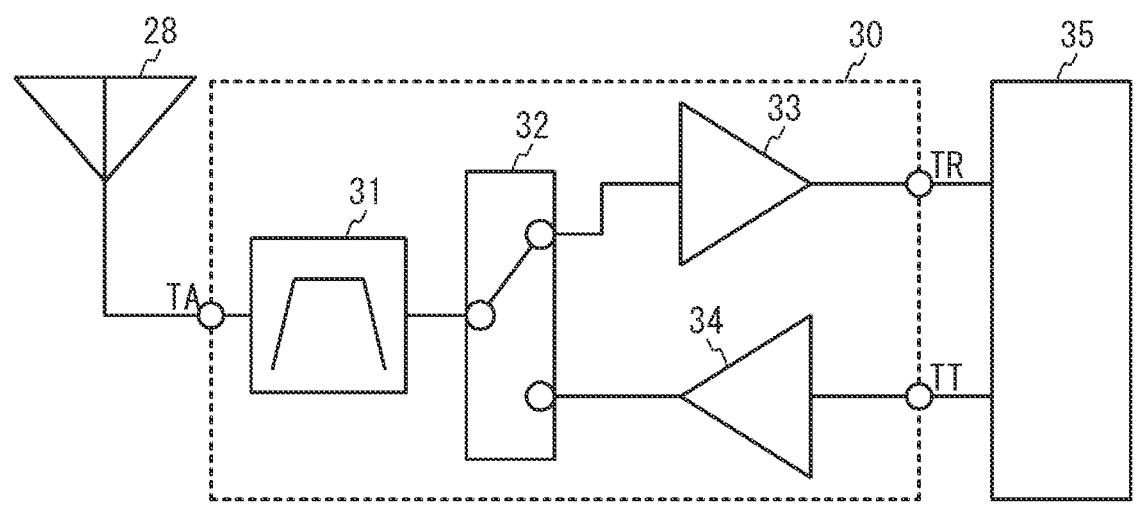
FIG. 24 is a circuit diagram of a communication module in accordance with a first variation of the second embodiment.

FIG. 24 is a circuit diagram of a communication module in accordance with a first variation of the second embodiment. As illustrated in FIG. 24, a module 30 includes a filter 31, a switch 32, a low-noise amplifier (LNA) 33, and a power amplifier (PA) 34.

The antenna 28 is connected to an antenna terminal TA. A first end of the filter 31 is connected to the antenna terminal TA. The switch 32 is connected to a second end of the filter 31. The input terminal of the LNA 33 and the output terminal of the PA 34 are connected to the switch 32. The output terminal of the LNA 33 is connected to a receive terminal TR. The input terminal of the PA 34 is connected to a transmit terminal TT. A radio frequency integrated circuit (RFIC) 35 is connected to the receive terminal TR and the transmit terminal TT.

The module 30 is, for example, a communication module for a time division duplex (TDD) communication system. In the TDD communication system, the transmit band and the receive band are the same band. The filter 31 is, for example, a bandpass filter, transmits high-frequency signals in the passband including the transmit band and the receiven band, and suppresses signals with other frequencies.

When a reception signal is received, the switch 32 connects the filter 31 and the LNA 33. Thus, the high-frequency signal received by the antenna 28 is filtered by the filter 31 into a signal in the receive band, amplified by the LNA 33, and output to the RFIC 35. When a transmission signal is transmitted, the switch 32 connects the filter 31 and the PA 34. Thus, the high-frequency signal output from the RFIC 35 is amplified by the PA 34, filtered by the filter 31 into a signal in the transmit band, and output from the antenna 28.

The filter 31 in the communication module in accordance with the first variation of the second embodiment may be the filter in accordance with any one of the first embodiment or its variations. The module may be a communication module of another circuit type.

Although the embodiments of the present invention have been described in detail, it is to be understood that the various change, substitutions, and alterations could be made hereto without departing from the spirit and scope of the invention.

What is claimed is:

1. A filter comprising:
    a first signal terminal;
    a second signal terminal;
    a ground terminal;
    a first resonance circuit including a first capacitor and a first inductor that are connected in parallel between the ground terminal and a first node electrically connected to the first signal terminal not through any capacitor, wherein no inductor is connected in series with the first capacitor between the first node and the ground terminal;
    a second resonance circuit including a second capacitor and a second inductor that are connected in parallel between the ground terminal and a second node electrically connected to the second signal terminal not through any capacitor; and
    a third resonance circuit including a third capacitor, a third inductor, and a first series inductor, the third capacitor and the third inductor being connected in parallel between a third node and the ground terminal, the first series inductor being connected in series with the third capacitor between the third node and the ground terminal, the third node being located in a path through which a high-frequency signal can be transmitted between the first node and the second node.

2. The filter according to claim 1, wherein in the second resonance circuit, an inductor is not connected in series with the second capacitor between the second node and the ground terminal.

3. The filter according to claim 1,
    wherein a plurality of dielectric layers are stacked,
    wherein the first series inductor includes a first line pattern provided on a first surface between adjacent dielectric layers of the plurality of dielectric layers, and
    wherein the first resonance circuit is connected in series with the first capacitor between the first node and the ground terminal, and does not include any line patterns provided on surfaces between respective two of the plurality of dielectric layers.

4. The filter according to claim 3, wherein the third inductor includes a second line pattern that is provided on a second surface, is electrically connected to the first line pattern through a via wiring penetrating through at least one dielectric layer of the plurality of dielectric layers, and extends in a direction intersecting a direction in which the first line pattern extends, the second surface being provided between adjacent dielectric layers of the plurality of dielectric layers and different from the first surface.

5. The filter according to claim 3, wherein at least one of the first inductor, the second inductor, or the third inductor includes a third line pattern provided on the first surface.

6. The filter according to claim 1, further comprising a fourth resonance circuit including a fourth capacitor, a fourth inductor, and a second series inductor, the fourth capacitor and the fourth inductor being connected in parallel between the ground terminal and a fourth node located between the third node and the second node in the path, and the second series inductor being connected in series with the fourth capacitor between the fourth node and the ground terminal.

7. The filter according to claim 1, wherein the first node and the third node are electrically connected to each other through a fifth capacitor, and the second node and the third node are electrically connected to each other through a sixth capacitor.

8. The filter according to claim 1, wherein the filter is a bandpass filter.

9. The filter according to claim 8, wherein the first capacitor, the second capacitor, the third capacitor, and an inductance component between the first capacitor and the ground terminal, an inductance component between the second capacitor and the ground terminal, and an inductance component between the third capacitor and the ground terminal form an attenuation pole at a frequency higher than a passband of the filter.

10. A multiplexer comprising the filter according to claim 1.

11. A communication module comprising the filter according to claim 1.

* * * * *